US008466537B1

(12) United States Patent
Papou et al.

(10) Patent No.: US 8,466,537 B1
(45) Date of Patent: Jun. 18, 2013

(54) MEMS POWER INDUCTOR WITH MAGNETIC LAMINATIONS FORMED IN A CRACK RESISTANT HIGH ASPECT RATIO STRUCTURE

(75) Inventors: Andrei Papou, San Jose, CA (US); William French, San Jose, CA (US); Peter J. Hopper, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 14 days.

(21) Appl. No.: 13/340,849

(22) Filed: Dec. 30, 2011

(51) Int. Cl.
*H01L 27/08* (2006.01)

(52) U.S. Cl.
USPC .................................. 257/531; 257/E21.022

(58) Field of Classification Search
CPC ....... H01L 23/5227; H01L 28/10; H01L 27/02; H01F 17/0013; H01F 41/041; H01F 41/046
USPC ........ 257/531, 628, 277, E21.022; 29/602.1, 29/600, 592.1
See application file for complete search history.

(56) References Cited

U.S. PATENT DOCUMENTS

| 3,881,244 | A | * | 5/1975 | Kendall ........................ 29/602.1 |
| 7,705,411 | B2 | | 4/2010 | Smeys et al. |
| 8,044,755 | B2 | | 10/2011 | Smeys et al. |

OTHER PUBLICATIONS

U.S. Appl. No. 13/098,656, filed May 2, 2011 by Peter Smeys et al.

* cited by examiner

*Primary Examiner* — Nikolay Yushin
(74) *Attorney, Agent, or Firm* — Eugene C. Conser; Wade J. Brady, III; Frederick J. Telecky, Jr.

(57) ABSTRACT

Magnetic laminations are formed in the openings of a first non-conductive structure, which is formed in the opening of a second non-conductive structure that has a maximum aspect ratio that is less than the maximum aspect ratio of the first non-conductive structure. The second non-conductive structure is more crack resistant than the first non-conductive structure, and thereby protects the first non-conductive structure and the magnetic laminations from environmental contaminants.

20 Claims, 20 Drawing Sheets

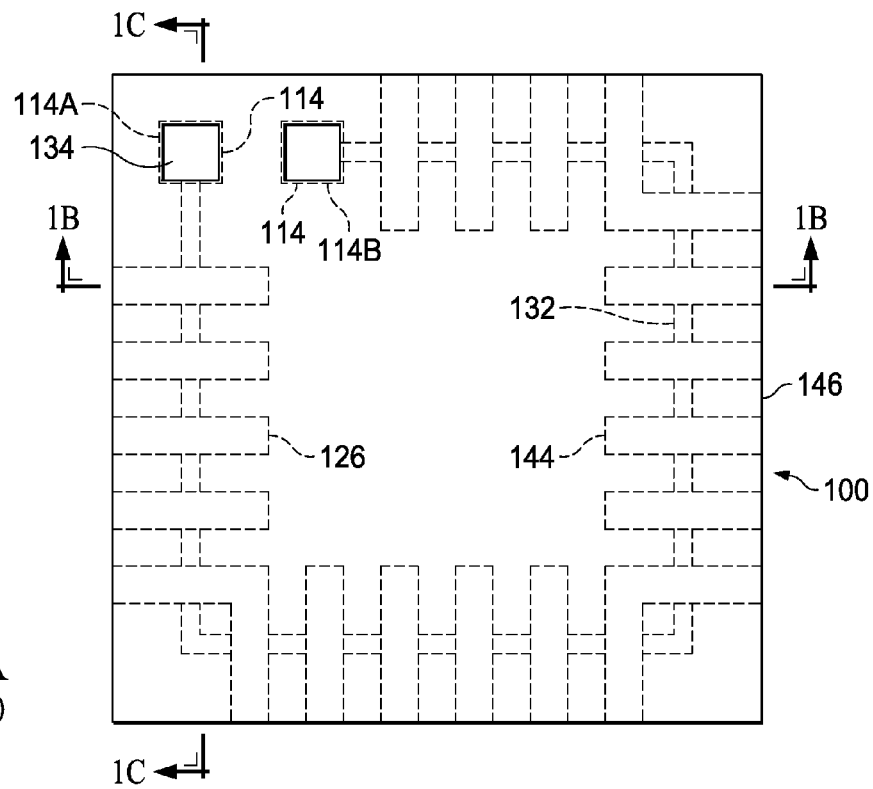
FIG. 1A (PRIOR ART)
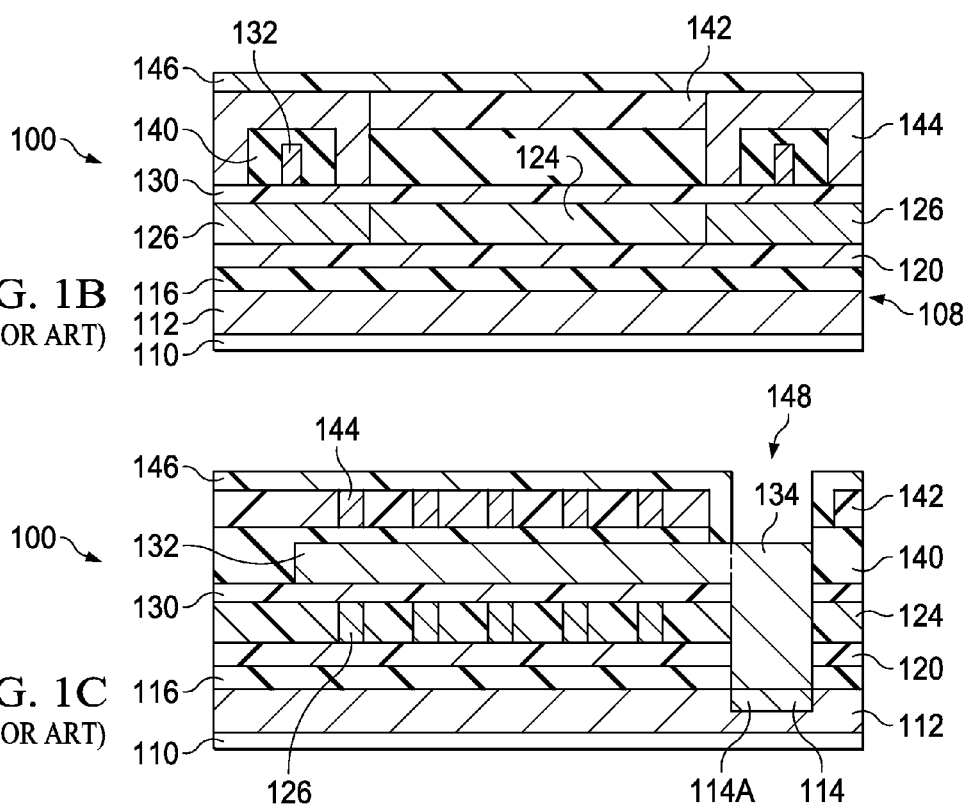
FIG. 1B (PRIOR ART)
FIG. 1C (PRIOR ART)

MEMS POWER INDUCTOR WITH MAGNETIC LAMINATIONS FORMED IN A CRACK RESISTANT HIGH ASPECT RATIO STRUCTURE

BACKGROUND OF THE INVENTION

1. Field of the Invention

The present invention relates to a MEMS power inductor and, more particularly, to a MEMS power inductor with magnetic laminations formed in a crack resistant high aspect ratio structure.

2. Description of the Related Art

A micro-electromechanical system (MEMS) power inductor is a semiconductor structure that is fabricated using the same types of steps that are used to fabricate conventional analog and digital CMOS circuits, (e.g., the deposition of layers of material and the selective removal of the layers of material).

FIGS. 1A-1C show views that illustrate a MEMS power inductor 100 as taught by U.S. Pat. No. 8,044,755, which issued on Oct. 15, 2011 to Peter Smeys et al. FIG. 1A shows a plan view, while FIG. 1B shows a cross-sectional view taken along line 1B-1B of FIG. 1A, and FIG. 1C shows a cross-sectional view taken along line 1C-1C of FIG. 1A.

As shown in FIGS. 1A-1C, inductor 100 is formed on the top surface of a conventionally-formed semiconductor structure 108, which includes a substrate 110 and a metal interconnect structure 112 that touches substrate 110. Substrate 110 has a number of structures, such as resistors, transistors, capacitors, diodes, and similar devices, which are formed in and on substrate 110.

Metal interconnect structure 112, in turn, is a multi-layered structure that electrically interconnects together the various devices that are formed in substrate 110 to realize an electrical circuit. Metal interconnect structure 112 has a number of layers of metal structures, including layers of metal traces, a layer of contacts that touch and lie between the conductive regions of substrate 110 and the metal traces in the lowest layer of metal structures, and layers of vias that touch and lie between vertically adjacent metal traces.

In addition, the top layer of metal structures has a number of bond pad structures 114, including bond pad structures 114A and 114B that represent the input and the output nodes of a MEMS inductor. Further, metal interconnect structure 112 has a layer of passivation material 116 that touches the bond pad structures 114, including bond pad structures 114A and 114B. Passivation layer 116 has a number of openings that expose the bond pad structures, including openings that expose the bond pad structures 114A and 114B.

As further shown in FIGS. 1A-1C, inductor 100 includes a stress relief layer 120 that lies on passivation layer 116. Stress relief layer 120, which prevents wafer bow, is able to laterally deform enough to absorb dimensional changes from the remaining materials used to form inductor 100, and thereby prevent stress from being transmitted to the underlying metal interconnect structure 112 and substrate 110. Stress relief layer 120 has openings that expose the bond pad structures 114A and 114B.

As additionally shown in FIGS. 1A-1C, inductor 100 includes a non-conducting lower structure 124 that touches stress relief layer 120, and a number of magnetic lower laminations 126 that are formed in lower structure 124. Lower structure 124 has openings that expose the bond pad structures 114A and 114B.

Further, inductor 100 includes a magnetic gap dielectric layer 130 that is formed on lower structure 124 and the magnetic lower laminations 126. Magnetic gap dielectric layer 130 has openings that expose the bond pad structures 114A and 114B. Passivation layer 116, lower structure 124, and magnetic gap dielectric layer 130 electrically isolate each of the magnetic lower laminations 126.

Inductor 100 further includes a copper structure that includes a (square) circular copper trace 132 that touches magnetic gap dielectric layer 130, and a pair of copper plugs 134 that extend down to touch the bond pad structures 114A and 114B. Copper trace 132, which lies directly over each of the magnetic lower laminations 126, is illustrated in FIGS. 1A-1C with a single loop, although copper trace 132 can alternately be formed to have multiple loops.

As further shown in FIGS. 1A-1C, inductor 100 includes a non-conducting base structure 140 that is formed on magnetic gap dielectric layer 130 and copper trace 132, and a non-conducting cap structure 142 that is formed on base structure 140. In addition, inductor 100 includes a number of magnetic upper laminations 144 that are formed in cap structure 142.

As shown in FIGS. 1A-1C, each magnetic upper lamination 144, which lies directly over copper trace 132, has via sections that extend down so that each magnetic upper lamination 144 lies along three cross-sectional sides of circular copper trace 132, while a corresponding magnetic lower lamination 126 extends along the fourth cross-sectional side of circular copper trace 132.

Inductor 100 also includes a passivation layer 146 that touches and lies over cap structure 142 and the magnetic upper laminations 144. Base structure 140, cap structure 142, and passivation layer 146 electrically isolate each of the magnetic upper laminations 144. In addition, openings 148 can be formed in base structure 140, cap structure 142, and passivation layer 146 to expose the copper plugs 134.

In operation, a current can flow into inductor 100 through bond pad structure 114A and out through bond pad structure 114B. A current can also flow in the opposite direction, flowing into inductor 100 through bond pad structure 114B and out through bond pad structure 114A. A current flowing through an inductor generates a magnetic field which produces a magnetic flux density. The magnetic flux density, in turn, is a measure of the total magnetic effect that is produced by the current flowing through the inductor.

Lower structure 124, magnetic gap dielectric layer 130, base structure 140, and cap structure 142 can each be formed with SU-8, which is a photo-patternable epoxy resin film. One advantage of SU-8 is that SU-8 has a high aspect ratio, which means that SU-8 can be formed to have openings that are much deeper than the widths of the openings. Magnetic laminations formed in deep narrow openings are thin and thereby minimize eddy currents. As a result, high aspect ratio openings are necessary to minimize eddy currents.

One problem with SU-8 is that SU-8 is relatively brittle, and more likely to crack than other photo-patternable materials, thereby potentially exposing inductor 100 to environmental contaminants. However, photo-patternable materials which have less stress and are more crack resistant have unacceptably low aspect ratios, which means that the openings are shallower and/or wider. Magnetic laminations formed in shallower and/or wider openings are thicker and thereby have unacceptably large eddy currents. Thus, there is a need to replace SU-8 with a photo-patternable material that has both a high aspect ratio and high crack resistance.

BRIEF DESCRIPTION OF THE DRAWINGS

FIGS. 1A-1C are views illustrating a MEMS power inductor 100 as taught by U.S. Pat. No. 8,044,755, which issued on Oct. 15, 2011 to Peter Smeys et al. FIG. 1A is a plan view. FIG. 1B is a cross-sectional view taken along line 1B-1B of FIG. 1A. FIG. 1C is a cross-sectional view taken along line 1C-1C of FIG. 1A.

FIG. 2A is a plan view. FIG. 2B is a cross-sectional view taken along line 2B-2B of FIG. 2A. FIG. 2C is a cross-sectional view taken along line 2C-2C of FIG. 2A.

FIGS. 3A-17A are plan views. FIGS. 3B-17B are cross-sectional views taken along line 3B-3B through line 17B-17B of FIGS. 3A-17A, respectively. FIGS. 3C-17C are cross-sectional views taken along line 3C-3C through line 17C-17C of FIGS. 3A-17A, respectively.

FIGS. 18A-20A are plan views. FIGS. 18B-20B are cross-sectional views taken along line 18B-18B through line 20B-20B of FIGS. 18A-20A, respectively. FIGS. 18C-20C are cross-sectional views taken along line 18C-18C through line 20C-20C of FIGS. 18A-20A, respectively.

DETAILED DESCRIPTION OF THE INVENTION

Figure 2A:
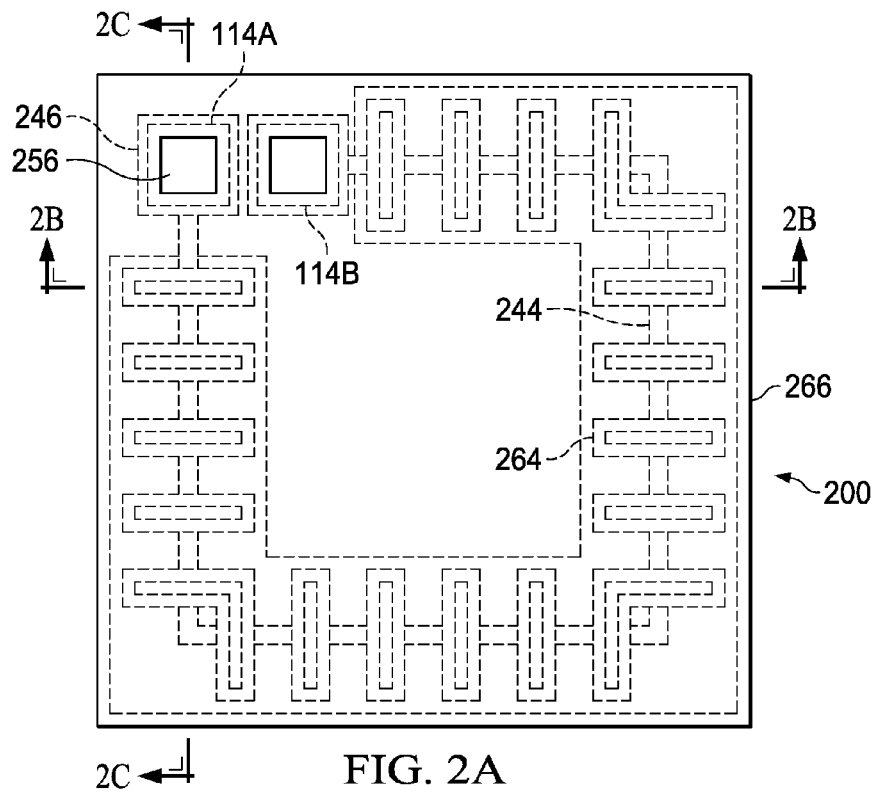
FIGS. 2A-2C are views illustrating an example of a MEMS power inductor 200 in accordance with the present invention.
Figure 2B:
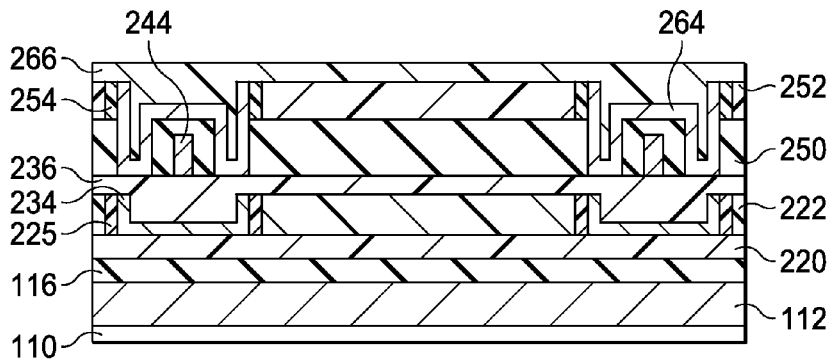
Figure 2C:
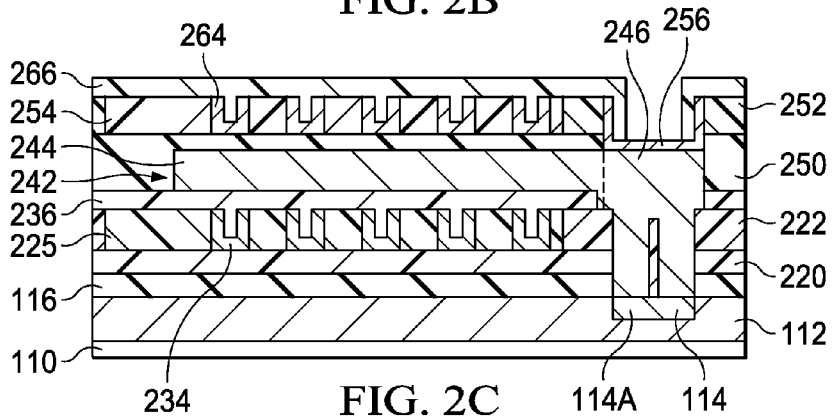

FIGS. 2A-2C show views that illustrate an example of a MEMS power inductor 200 in accordance with the present invention. FIG. 2A shows a plan view, while FIG. 2B shows a cross-sectional view taken along line 2B-2B of FIG. 2A, and FIG. 2C shows a cross-sectional view taken along line 2C-2C of FIG. 2A.

As described in greater detail below, the magnetic laminations of the present invention are formed in a non-conductive structure that has both a high aspect ratio and high crack resistance by utilizing a high aspect ratio material to form the magnetic laminations, and a low aspect ratio material to surround and provide crack resistance for the high aspect ratio material. As a result, any cracks in the high aspect ratio material are protected from environmental contaminants by the low aspect ratio material.

As shown in FIGS. 2A-2C, inductor 200, which in the present example is formed on the top surface of conventionally-formed semiconductor structure 108, includes a bottom structure 220 that touches the top surface of passivation layer 116. Bottom structure 220 has openings that expose the bond pad structures 114A and 114B, a low aspect ratio (i.e., 2:1 or lower), a low intrinsic (as deposited) stress (e.g., about 10× less than other photo-patternable materials such as polyimide, benzocyclobutene (BCB), epoxy resin film (SU-8), or TMMR-52000 by TOK (http://www.tok.co.jp/en/)), and a low Young's modulus (e.g., about 10× less than other photo-patternable materials such as polyimide, BCB, SU-8, or TMMR-S2000). In addition, bottom structure 220 is non-conductive and crack resistant.

As further shown in FIGS. 2A-2C, inductor 200 also includes an outer structure 222 that touches bottom structure 220. Outer structure 222 has a large opening that exposes the top surface of bottom structure 220 around the periphery of bottom structure 220. Outer structure 222 also has openings that expose the bond pad structures 114A and 114B, a low aspect ratio (i.e., 2:1 or lower), a low intrinsic (as deposited) stress (e.g., about 10× less than other photo-patternable materials such as polyimide, BCB, SU-8, or TMMR-52000), and a low Young's modulus (e.g., about 10× less than other photo-patternable materials such as polyimide, BCB, SU-8, or TMMR-52000). In addition, outer structure 222 is non-conductive and crack resistant.

Inductor 200 further includes a bottom inner structure 225 that lies within the large opening to touch bottom structure 220 and outer structure 222. Inner structure 225 has a number of lamination openings that expose the top surface of bottom structure 220. Inner structure 225 is also non-conductive, and has a high aspect ratio (i.e., 3:1 and higher).

In addition, inductor 200 includes a number of U-shaped controlled seam magnetic lower laminations 234 that lie in the lamination openings to touch bottom structure 220 and inner structure 225. The thickness of the U-shaped controlled seam magnet lower laminations 234 must be thin enough to minimize eddy currents. Further, the U-shaped controlled-seam magnetic lower laminations 234 are totally electrically isolated from each other and all other conductive structures.

Inductor 200 further includes a top structure 236 that touches and lies over outer structure 222, inner structure 225, and the U-shaped controlled-seam magnetic lower laminations 234. Top structure 236 has openings that expose the bond pad structures 114A and 114B, a low aspect ratio, a low intrinsic (as deposited) stress, and a low Young's modulus. In addition, top structure 236 is non-conductive and crack resistant.

Bottom structure 220, outer structure 222, and top structure 236 form a crack resistant structure that surrounds, electrically isolates, and protects inner structure 225 and each of the magnetic lower laminations 234 from environmental contaminants. As a result, any cracking of inner structure 225 is contained by bottom structure 220, outer structure 222, and top structure 236.

Inductor 200 also includes a conductive structure 242 that includes a (square) circular trace 244 that touches top structure 236, and plugs 246 at each end of trace 244 that extend down to touch the bond pad structures 114A and 114B. Trace 244, which lies directly over each of the controlled-seam magnetic lower laminations 234, is illustrated in FIGS. 2A-2C with a single loop, although trace 244 can alternately be formed to have multiple loops.

As additionally shown in FIGS. 2A-2C, inductor 200 includes an isolation structure 250 that is formed on top structure 236, trace 244, and the plugs 246. Isolation structure 250 has a low aspect ratio, a low intrinsic (as deposited) stress, and a low Young's modulus. In addition, isolation structure 250 is non-conductive and crack resistant. As shown in the present example, isolation structure 250 can optionally have openings that expose the top surfaces of the plugs 246.

Further, inductor 200 includes an outer structure 252 that touches and lies over isolation structure 250. Outer structure 252 has a large opening that exposes the top surface of isolation structure 250 around the periphery of bottom structure 220. Outer structure 252 can also optionally have openings that expose the plugs 246. Further, outer structure 252 has a low aspect ratio, a low intrinsic (as deposited) stress, and a low Young's modulus. In addition, outer structure 252 is non-conductive and crack resistant.

Inductor 200 also includes a a top inner structure 254 that lies within the large opening in outer structure 252 to touch isolation structure 250 and outer structure 252. Inner structure 254 has a number of lamination openings that expose the top surface of isolation structure 250. Inner structure 254 is non-conductive, and the lamination openings have a high aspect ratio. Inductor 200 can also have a number of metal structures 256 that touch the plugs 246 when openings are optionally formed to expose the top surfaces of the plugs 246.

In addition, inductor 200 includes a number of U-shaped controlled-seam magnetic upper laminations 264 that lie in the lamination openings to touch isolation structure 250 and inner structure 254. The thicknesses of the laminations must be thin enough to minimize eddy currents. Further, the controlled-seam magnetic upper laminations 264 are totally electrically isolated from each other and all other conductive structures.

Inductor 200 further includes a top structure 266 that touches outer structure 252, inner structure 254, and the controlled-seam magnetic upper laminations 264. Top structure 266 can have openings that expose the metal structures 256 when openings are optionally formed to expose the top surfaces of the plugs 246. Top structure 266 also has a low aspect ratio, a low intrinsic (as deposited) stress, and a low Young's modulus. In addition, top structure 266 is non-conductive and crack resistant.

Isolation structure 250, outer structure 252, and top structure 266 form a crack resistant structure that surrounds, electrically isolates, and protects inner structure 254 and each of the controlled-seam magnetic upper laminations 264 from environmental contaminants. As a result, any cracking of inner structure 254 is contained by isolation structure 250, outer structure 252, and top structure 266.

The controlled-seam magnetic upper laminations 264 lie directly vertically over the magnetic lower laminations 234 and trace 244. In addition, portions of each magnetic upper lamination 264 extend down so that each magnetic upper lamination 264 lies along three cross-sectional sides of trace 244, while a corresponding magnetic lower lamination 234 extends along the fourth cross-sectional side of trace 244.

As shown in FIGS. 2A-2C, in the present example, each controlled-seam magnetic upper lamination 264 is vertically spaced apart from and lies above the corresponding magnetic lower lamination 234. Alternately, each controlled-seam magnetic upper lamination 264 can touch the corresponding controlled-seam magnetic lower lamination 234.

Thus, in the present example, the magnetic laminations are formed in a structure with a high aspect ratio material, while the high aspect ratio material and the magnetic laminations are protected from cracks and the entry of environmental contaminants by a surrounding a low aspect ratio material that has a high crack resistance.

FIGS. 3A-3C through FIGS. 17A-17C show views that illustrate an example of a method of forming a MEMS power inductor in accordance with the present invention. FIGS. 3A-17A show plan views, while FIGS. 3B-17B show cross-sectional views taken along line 3B-3B through line 17B-17B of FIGS. 3A-17A, respectively, and FIGS. 3C-17C show cross-sectional views taken along line 3C-3C through line 17C-17C of FIGS. 3A-17A, respectively.

Figure 3A:
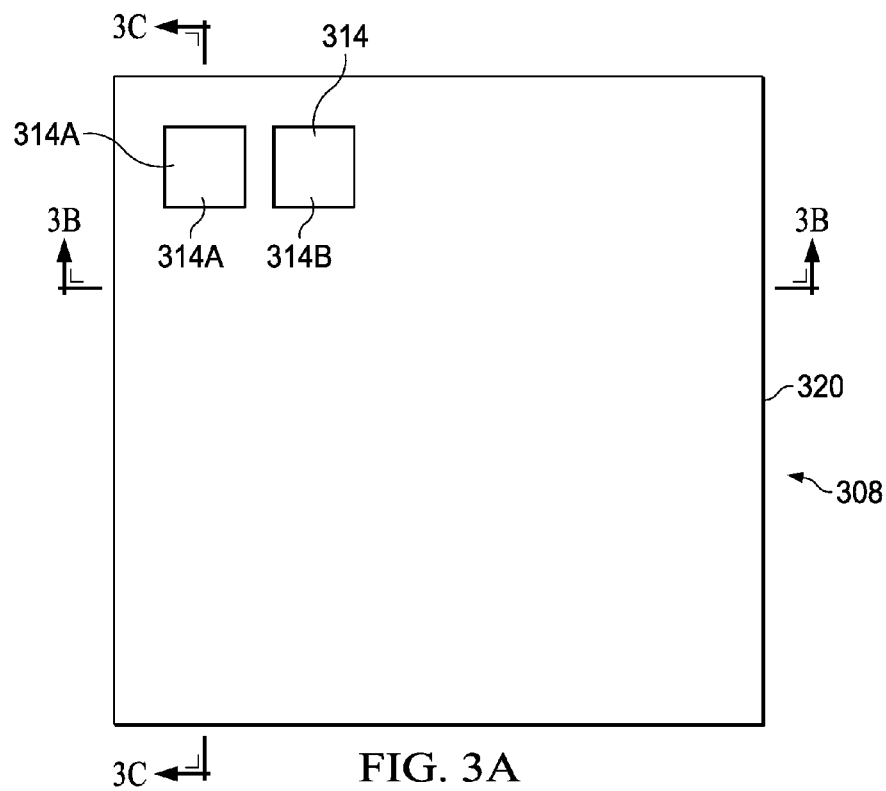
FIGS. 3A-3C through FIGS. 17A-17C are views illustrating an example of a method of forming a MEMS power inductor in accordance with the present invention.
Figure 3B:
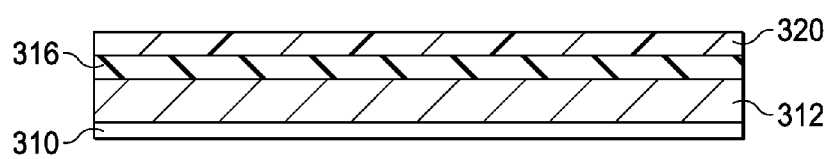
Figure 3C:
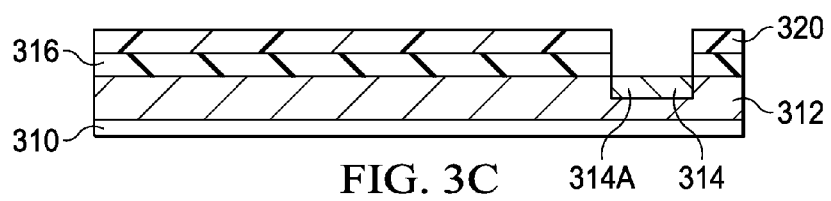

As shown in FIGS. 3A-3C, the method utilizes a conventionally-formed semiconductor wafer 308 that includes a number of identical die-sized substrate regions 310 (separated from each other by saw streets), and a corresponding number of identical metal interconnect structures 312 that are connected to the substrate regions 310. (Only a portion of one die-sized region 310 and a portion of one metal interconnect structure 312 are shown for simplicity.) Each substrate region 310 includes a number of structures, such as resistors, transistors, capacitors, diodes, and similar devices, which are formed in and on the substrate region 310.

Each metal interconnect structure 312, in turn, is a multi-layered structure that electrically interconnects together the various devices that are formed in the substrate 310 to realize an electrical circuit. Each metal interconnect structure 312 has a number of layers of metal structures, including layers of metal traces, a layer of contacts that touch and lie between the conductive regions of the substrate 310 and the metal traces in the lowest layer of metal traces, and layers of vias that touch and lie between vertically adjacent metal traces.

In addition, the top layer of metal structures in each metal interconnect structure 312 has bond pad structures 314 that provide points of external electrical connection. The bond pad structures 314 include bond pad structures 314A and 314B that represent the external input and output nodes of a MEMS inductor. Further, each metal interconnect structure 312 has a layer of passivation material 316 that touches the bond pad structures 314, including bond pad structures 314A and 314B.

The passivation layer 316, in turn, has a number of openings that expose the bond pad structures 314, including openings that expose the bond pad structures 314A and 314B. In addition, the passivation layer 316 can be implemented with, for example, silicon nitride, silicon dioxide, or a combination of the two. The following steps, which illustrate the formation of a single inductor, are simultaneously performed on each metal interconnect structure 312 to form an inductor on each metal interconnect structure 312.

As shown in FIGS. 3A-3C, the method begins by forming a bottom structure 320 on the top surface of the passivation layer 316. In the present example, bottom structure 320 is formed by conventionally spinning a polymer, such as a siloxane-based polymer like one of the polymers in the series SINR-3110 through SINR-3170 from Shin-Etsu Chemical (http://www.shinetsu.jp/e/), onto the top surface of passivation layer 316 in a conventional manner to form a polymer layer.

Each of the polymers in the series SINR-3110 through SINR-3170 from Shin-Etsu Chemical is non-conductive and photo-patternable. In addition, each of the polymers in the series SINR-3110 through SINR-3170 has a high crack resistance, a low aspect ratio (i.e., 2:1 and lower), a low intrinsic stress (e.g., about 10× less than other photo-patternable materials such as polyimide, benzocyclobutene (BCB), epoxy resin film (SU-8), or TMMR-52000 by TOK (http://www.tok.co.jp/en/)), and a low Young's modulus (e.g., about 10× less than other photo-patternable materials such as polyimide, BCB, SU-8, or TMMR-52000).

After the polymer layer has formed, the polymer layer is soft baked, and then selectively exposed to ultraviolet light by a mask aligner to transfer a geometric pattern into the soft baked polymer. Following this, the exposed polymer is baked again, and then developed, such as by using immersion development at room temperature.

After the development, the unexposed regions of the developed polymer are rinsed away and removed to form an uncured structure with openings that expose the bond pad structures 314A and 314B. Once the unexposed regions of the developed polymer have been removed, the developed polymer is cured to complete the formation of bottom structure 320 with openings that expose the bond pad structures 314A and 314B.

Figure 4A:
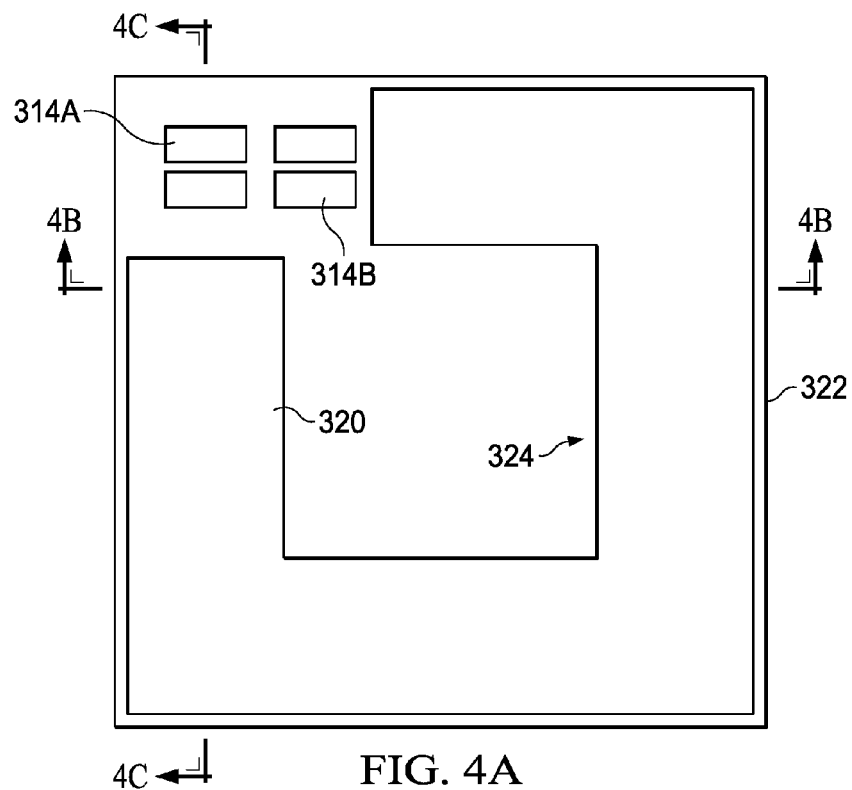
Figure 4B:
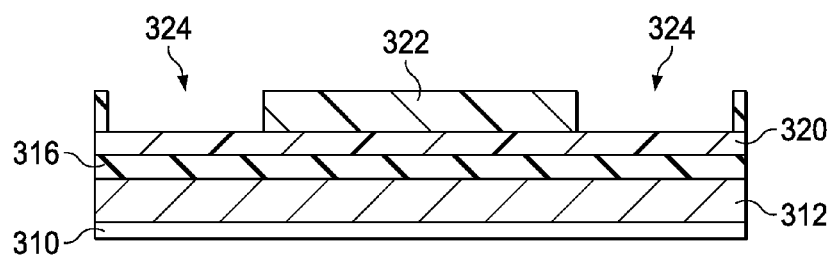
Figure 4C:
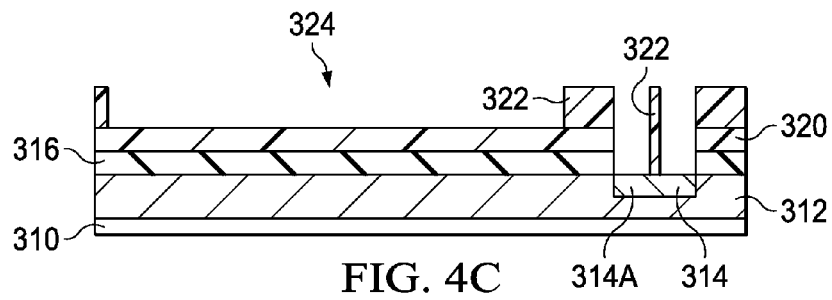

As shown in FIGS. 4A-4C, after bottom structure 320 has been formed, an outer structure 322 is formed on bottom structure 320. In the present example, outer structure 322 is formed by conventionally spinning a polymer, such as a siloxane-based polymer like one of the polymers in the polymer series SINR-3110 through SINR-3170 from Shin-Etsu Chemical, onto the top surface of bottom structure 320 in a conventional manner to form a polymer layer.

After the polymer layer has been formed, the polymer layer is soft baked, and then selectively exposed to ultraviolet light by a mask aligner to transfer a geometric pattern into the soft baked polymer. Following this, the exposed polymer is baked again, and then developed, such as by using immersion development at room temperature.

After the development, the unexposed regions of the developed polymer are rinsed away and removed to form an uncured structure with a large opening 324 that exposes bottom structure 320, and openings that expose the bond pad structures 314A and 314B. Once the unexposed regions of the developed polymer have been removed, the developed polymer is cured to form outer structure 322 with large opening 324 that exposes bottom structure 320, and openings that expose the bond pad structures 314A and 314B.

Figure 5A:
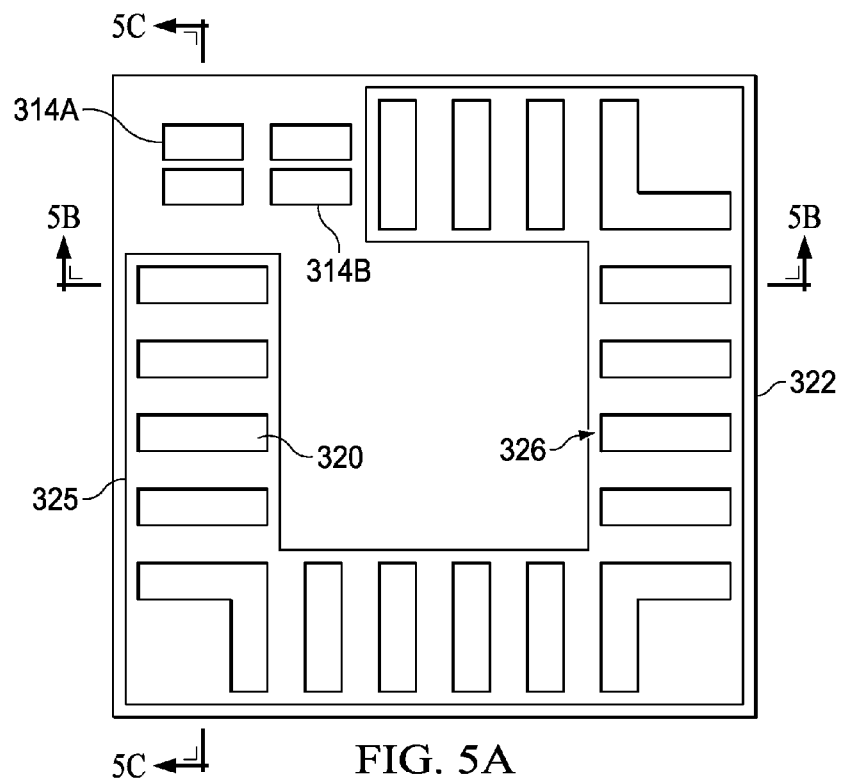
Figure 5B:
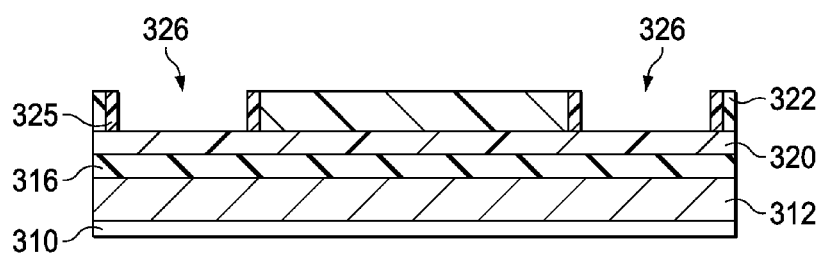
Figure 5C:
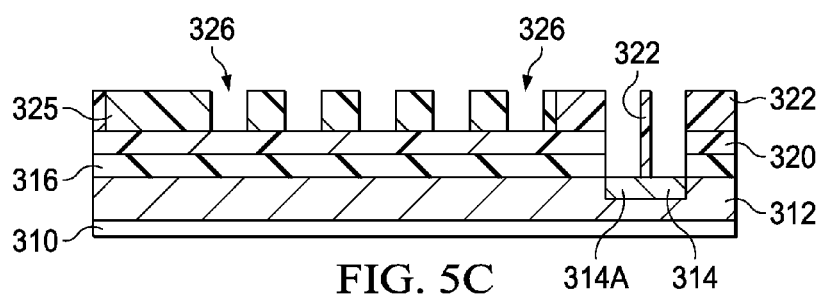

As shown in FIGS. 5A-5C, after outer structure 322 has been formed, an inner structure 325 is formed to lie within large opening 324 and touch bottom structure 320 and outer structure 322. In the present example, inner structure 325 is formed by conventionally spinning a high aspect ratio material, such as SU-8 or TMMR-52000 by TOK (http://www.tok.co.jp/en/), onto the top surface of bottom structure 320 in a conventional manner to fill up large opening 324 and form a material region. (A thin layer of the high aspect ratio material can lie over outer structure 322.)

SU-8 and TMMR-52000 both have high aspect ratios, i.e., 3:1 or higher. In addition, SU-8 and TMMR-52000 both have a high intrinsic stress and a high Young's modulus, and are prone to cracking. (BCB and polyimide, which have a high intrinsic stress, a high Young's modulus, and are prone to cracking similar to SU-8 and TMMR-52000, are both low aspect ratio materials, i.e., 2:1 and lower.) Thus, outer structure 322 and inner structure 325 have different material characteristics. Further, inner structure 325 has a maximum aspect ratio that is greater than a maximum aspect ratio of bottom structure 320 and outer structure 322.

After the material region has been formed, the material region is soft baked, and then selectively exposed to ultraviolet light by a mask aligner to transfer a geometric pattern into the soft baked material. Following this, the exposed material is baked again, and then developed, such as by using immersion development at room temperature.

After the development, the unexposed regions of the developed material are rinsed away and removed to form an uncured structure with a number of lamination openings 326. Once the unexposed regions of the developed polymer have been removed, the developed polymer is cured to form inner structure 325 with the lamination openings 326.

The lamination openings 326 have high aspect ratios (i.e., 3:1 and higher) that allow a large number of thin magnetic laminations to be subsequently formed. The larger the number of thin magnetic laminations, the larger the magnetic effect. Thus, to obtain a usable level of magnetic effect, it is critical that the lamination openings 326 have high aspect ratios.

Figure 6A:
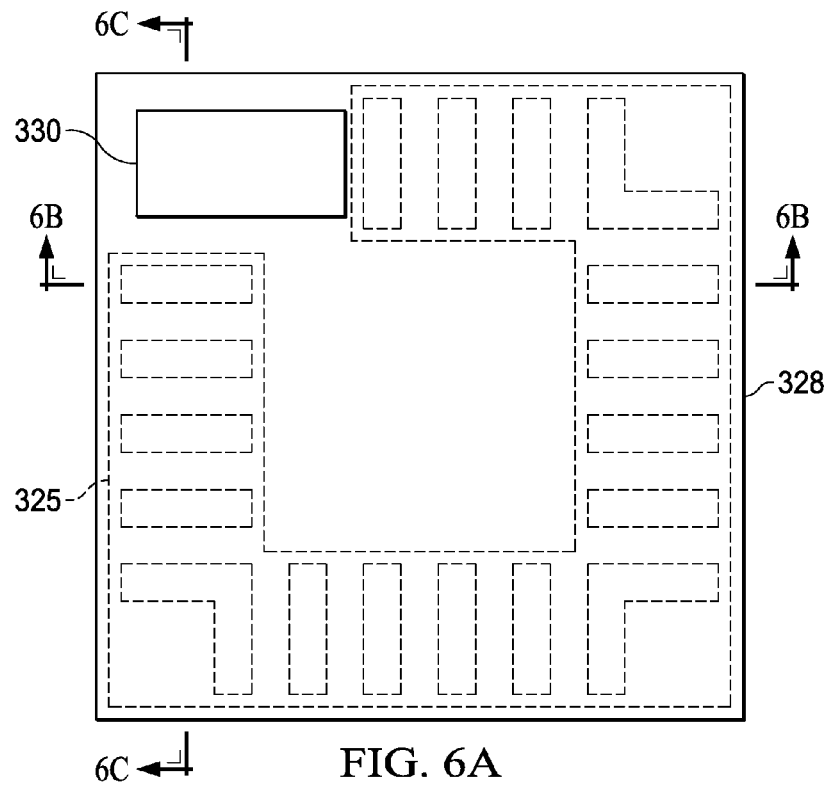
Figure 6B:
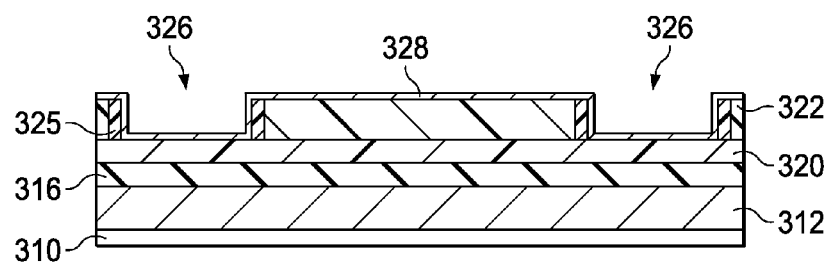
Figure 6C:
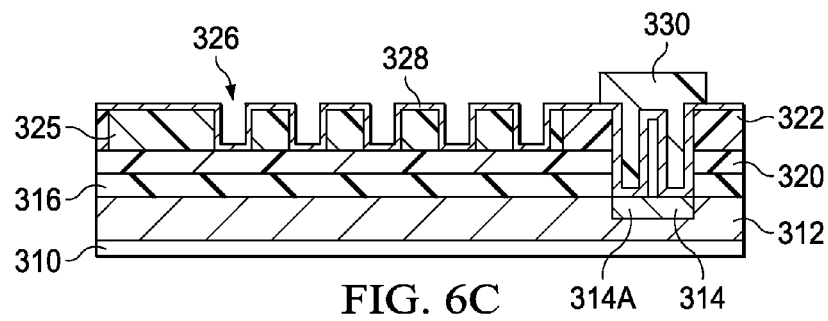

As shown in FIGS. 6A-6C, after inner structure 325 has been formed, a seed layer 328 is formed on bottom structure 320, outer structure 322, and inner structure 325 to line the lamination openings 326. Seed layer 328 can be implemented with, for example, 300 Å of titanium and 3000 Å of copper. (The lower titanium layer enhances the adhesion of the copper.)

Alternately, seed layer 328 can be implemented with a high-resistance magnetic material, such as amphorous CoTaZr or CoNbZr. Following this, a mask 330 is conventionally formed and patterned on seed layer 328. As shown in FIGS. 6A-6C, mask 330, which can be implemented with, for example, NR2 by Futurrex (http://futurrex.com/en/), covers and protects the portion of the seed layer 328 that lies over the bond pad structures 314A and 314B.

Figure 7A:
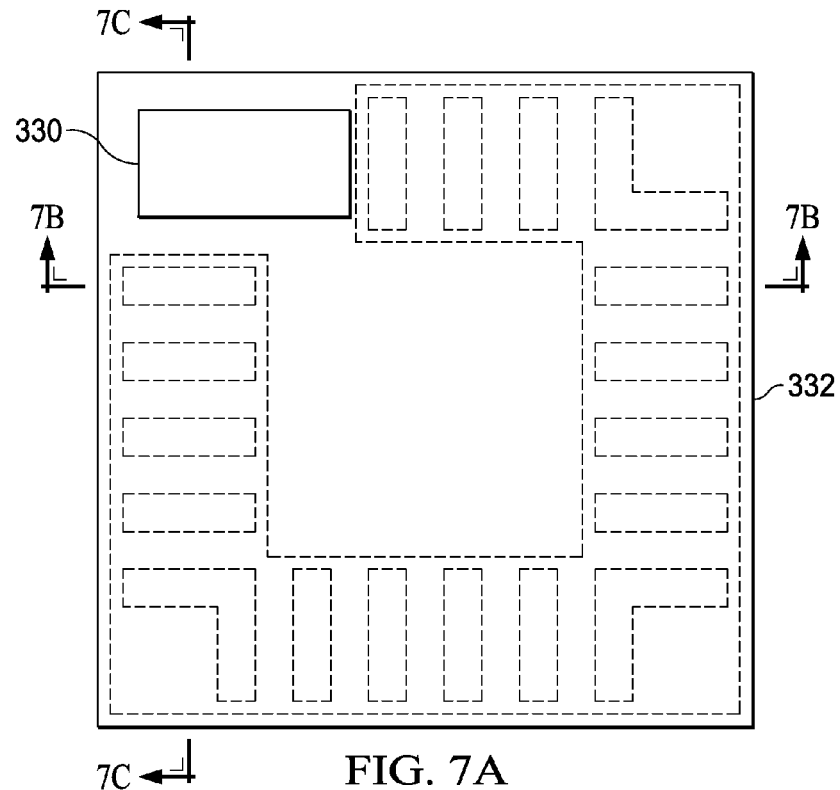
Figure 7B:
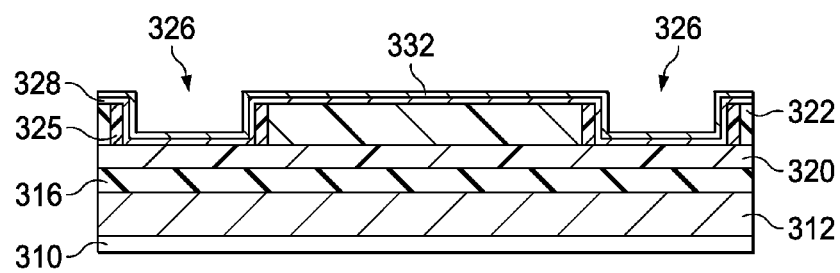
Figure 7C:
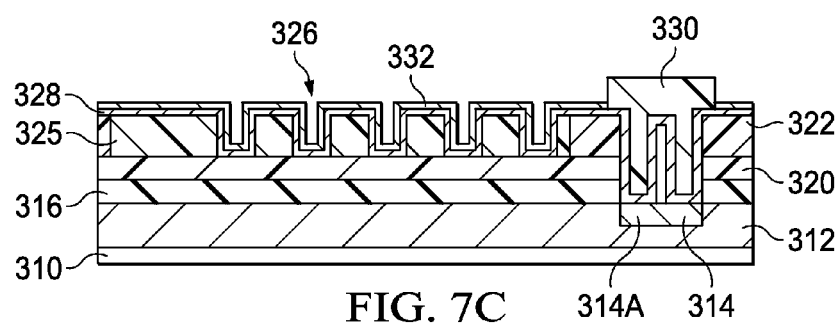

Following the formation of mask 330, as shown in FIGS. 7A-7C, a soft magnetic material, such as $Ni_{80}Fe_{20}$ (permalloy), $Ni_{45}Fe_{20}$ (orthonol), or cobalt nickel iron (CoNiFe), is electroplated to form a magnetic material layer 332 that lines, but does not fill up, the lamination openings 326 in inner structure 325.

Figure 8A:
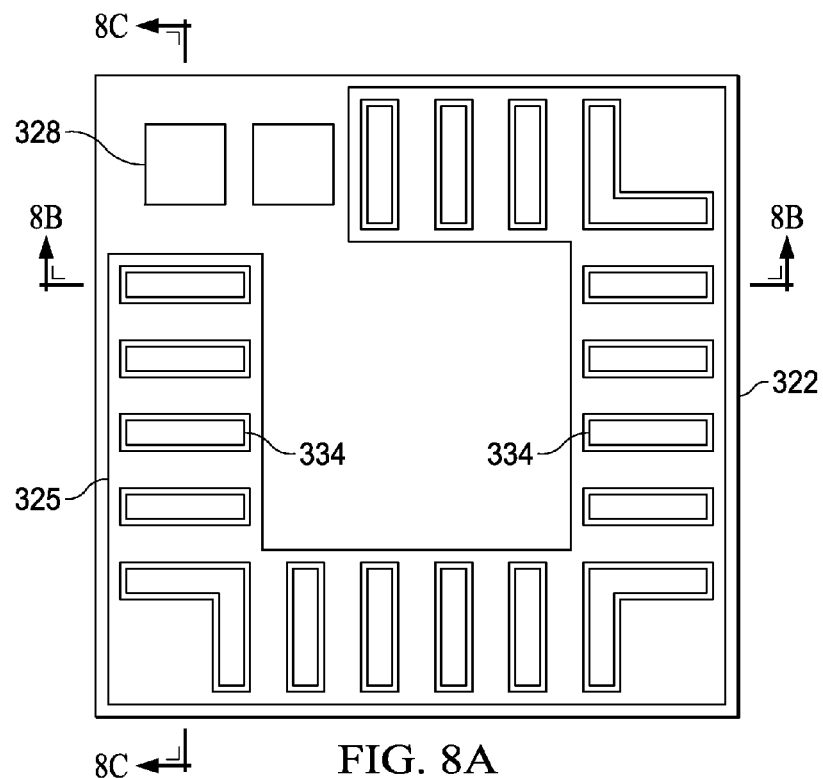
Figure 8B:
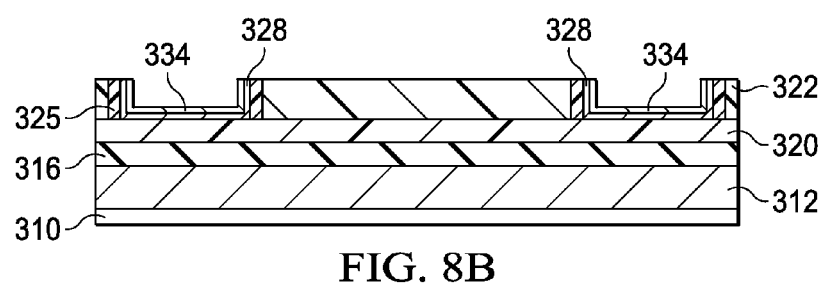
Figure 8C:
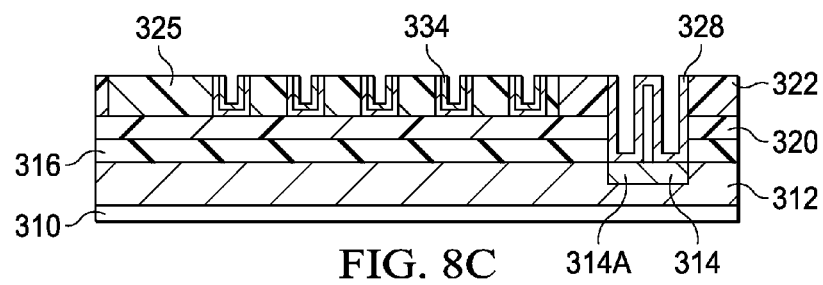

After this, as shown in FIGS. 8A-8C, mask 330, magnetic material layer 332, and small portions of outer structure 322 and inner structure 325 are planarized to form a number of U-shaped controlled-seam magnetic lower laminations 334 around the periphery of bottom structure 320. Thus, the top surfaces of outer structure 322, inner structure 325, and each of the controlled-seam magnetic lower structures 334 lie substantially in a single plane. The U-shaped controlled-seam magnetic lower laminations 334 must be thin to minimize eddy currents. Following the planarization, the remains of mask 330 are removed in a conventional manner.

Figure 9A:
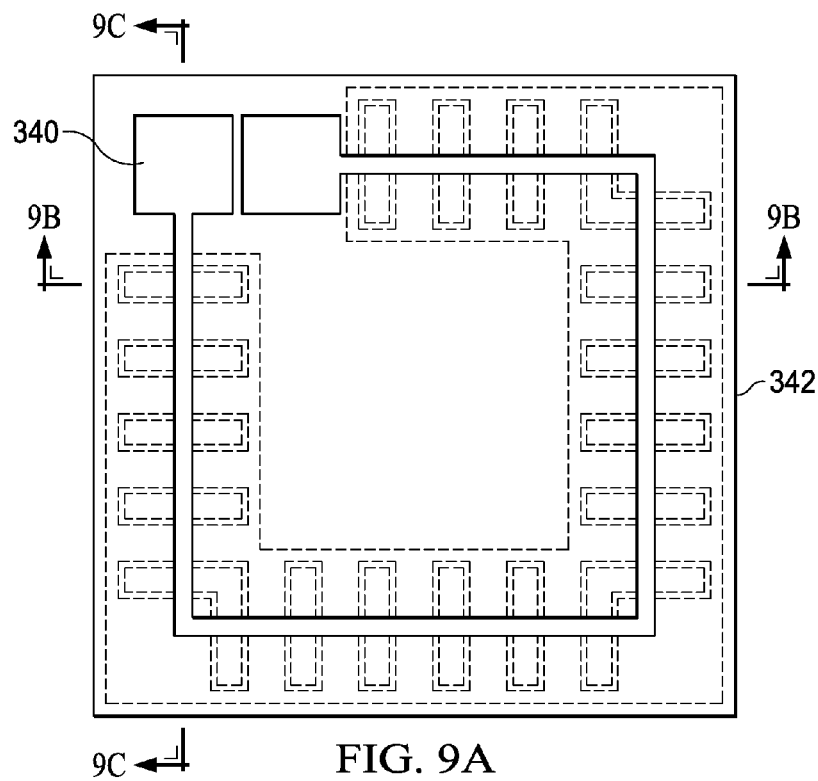
Figure 9B:
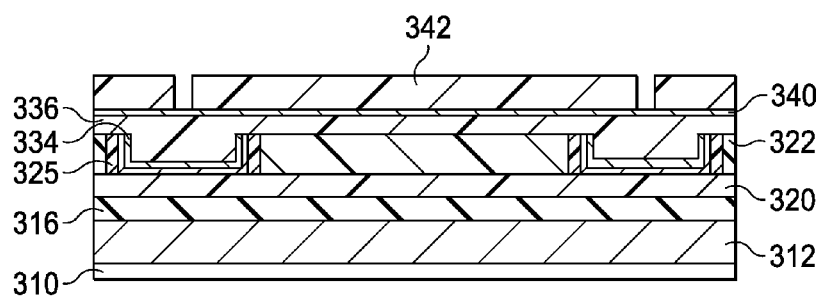
Figure 9C:
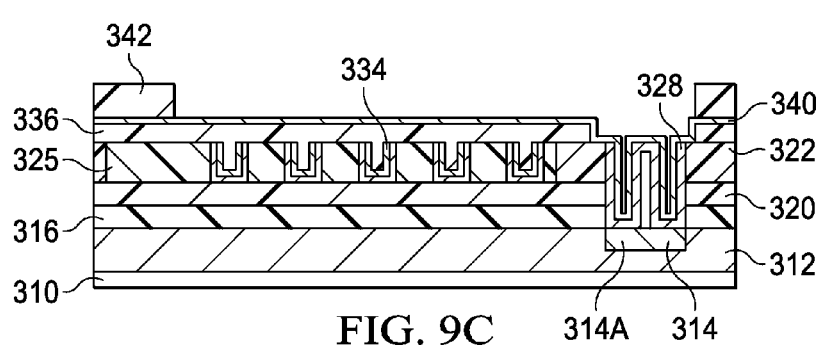

Next, as shown in FIGS. 9A-9C, a top structure 336 is formed on outer structure 322, inner structure 325, and the controlled-seam magnetic lower laminations 334. In the present example, top structure 336 is formed by spinning a polymer, such as a siloxane-based polymer like one of the polymers in the polymer series SINR-3110 through SINR-3170 from Shin-Etsu Chemical, onto the top surfaces of outer structure 322, inner structure 325, and the controlled-seam magnetic lower laminations 334 in a conventional manner to form a polymer layer.

After the polymer layer has been formed, the polymer layer is soft baked, and then selectively exposed to ultraviolet light by a mask aligner to transfer a geometric pattern into the soft baked polymer. Following this, the exposed polymer is baked again, and then developed, such as by using immersion development at room temperature.

After the development, the unexposed regions of the developed polymer are rinsed away and removed to form an uncured structure with openings that expose the portion of the seed layer 328 that lies over the bond pad structures 314A and 314B. Once the unexposed regions of the developed polymer have been removed, the developed polymer is cured to form top structure 336 with openings that expose the portion of the seed layer 328 that lies over the bond pad structures 314A and 314B.

After top structure 336 has been formed, a seed layer 340 is formed on top structure 336 and the portion of the seed layer 328 that lies over the bond pad structures 314A and 314B. Seed layer 340 can be implemented with, for example, 300 Å of titanium and 3000 Å of copper. After seed layer 340 has been formed, a mold 342 is formed on seed layer 340. Mold 342 can be formed, for example, by forming and patterning a photoresist layer, such as NR2, in a conventional manner.

Figure 10A:
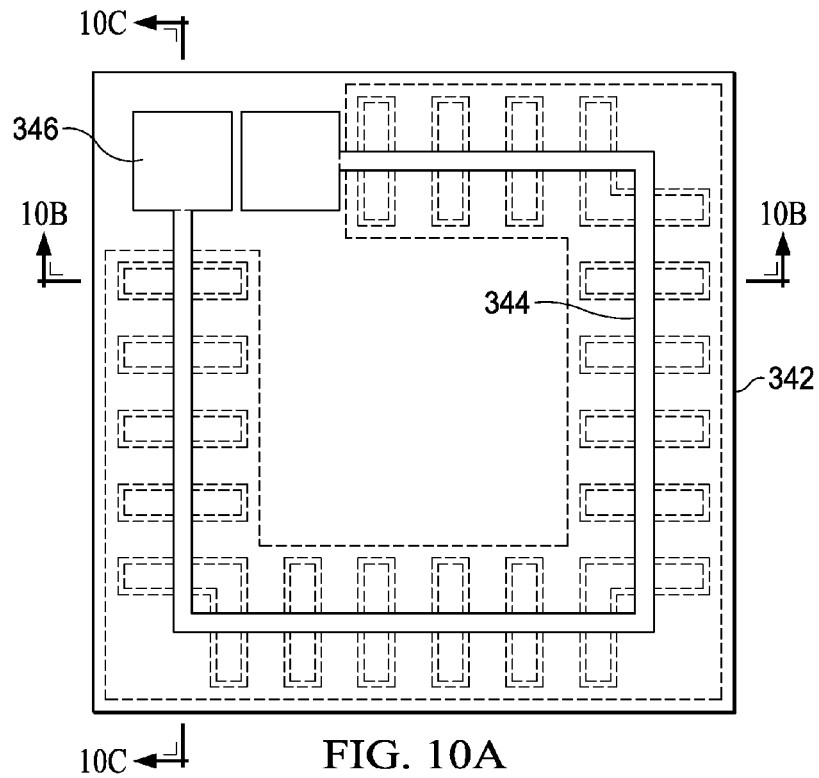
Figure 10B:
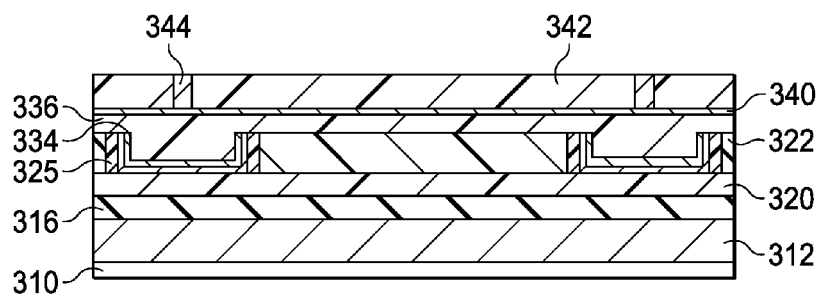
Figure 10C:
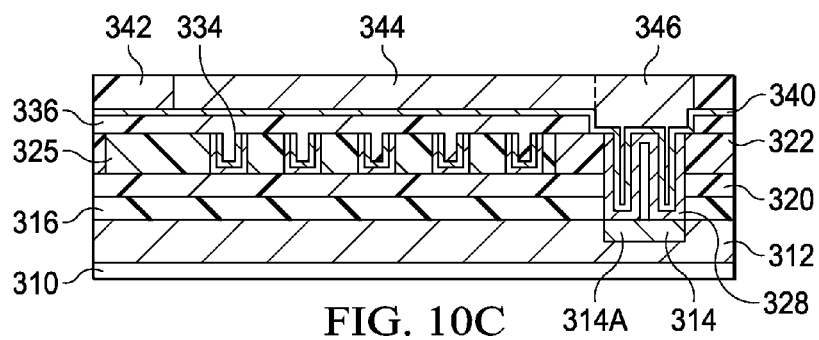

As shown in FIGS. 10A-10C, following the formation of mold 342, copper is electroplated to form a copper structure that includes a circular trace 344 with plugs 346 that extend down from the opposite ends of trace 344 to touch the portion of the seed layer 328 that lies over the bond pad structures 314A and 314B. Trace 344 is illustrated with a single loop, although trace 344 can be formed to have multiple loops. After this, mold 342 is removed, followed by the removal of the exposed regions of seed layer 340.

Figure 11A:
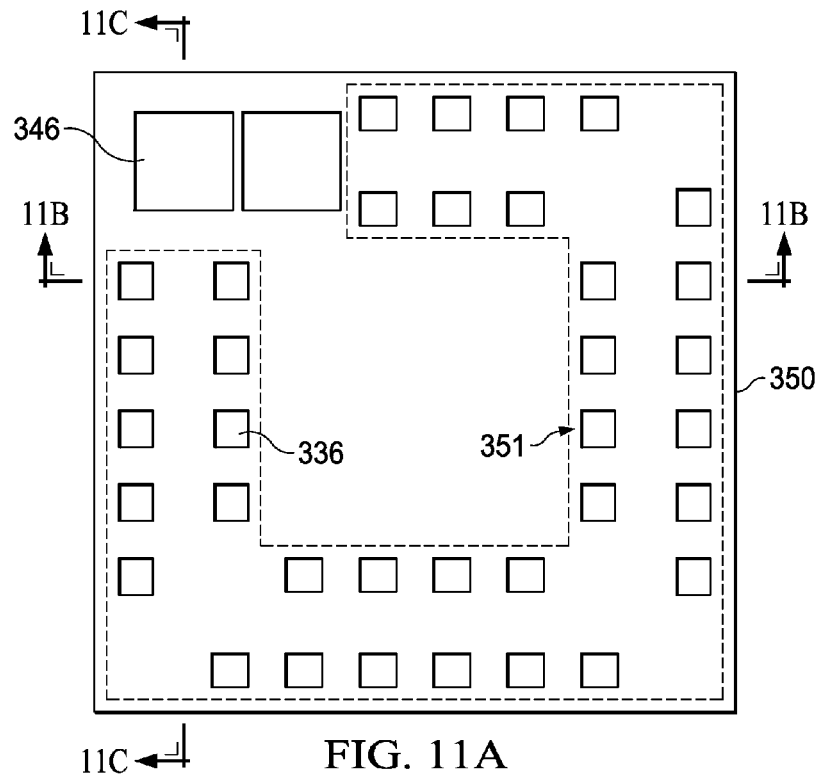
Figure 11B:
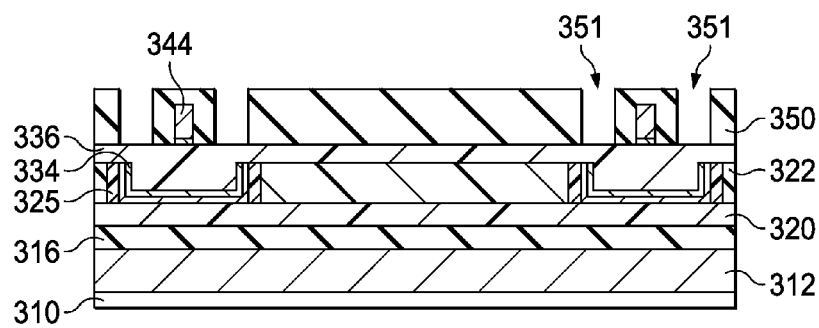
Figure 11C:
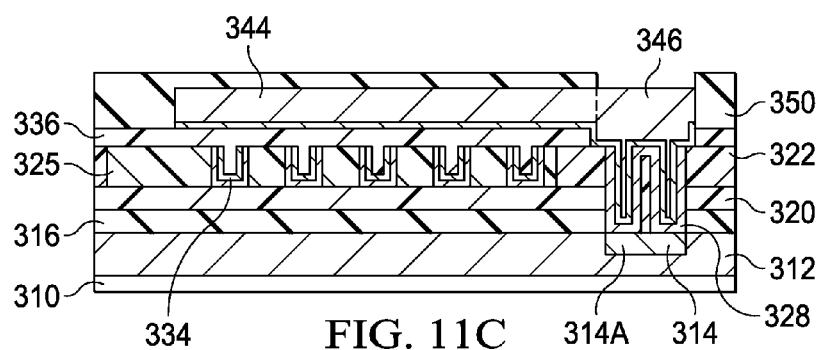

As shown in FIGS. 11A-11C, after mold 342 and the exposed regions of seed layer 340 have been removed, an isolation structure 350 is formed on top structure 336, trace 344, and the plugs 346. In the present example, isolation structure 350 is formed by conventionally spinning a polymer, such as a siloxane-based polymer like one of the polymers in the polymer series SINR-3110 through SINR-3170 from Shin-Etsu Chemical, onto top structure 336, trace 344, and the plugs 346 in a conventional manner to form a polymer layer.

After the polymer layer has been formed, the polymer layer is soft baked, and then selectively exposed to ultraviolet light by a mask aligner to transfer a geometric pattern into the soft baked polymer. Following this, the exposed polymer is baked again, and then developed, such as by using immersion development at room temperature.

After the development, the unexposed regions of the developed polymer are rinsed away and removed to form an uncured structure with a number of side wall openings 351 that expose regions of top structure 336 that lie directly over the controlled-seam magnetic lower laminations 334, along with openings that expose the plugs 346.

Once the unexposed regions of the developed polymer have been removed, the developed polymer is cured to complete the formation of isolation structure 350 with the side wall openings 351 that expose regions of top structure 336 that lie directly over the controlled-seam magnetic lower laminations 334, and openings that expose the plugs 346.

The formation of openings that expose the plugs 346 is optional, being utilized to provide access for external connections to the plugs 346. If trace 344 and the plugs 346 are thicker than the maximum thickness of the polymer that can be spun on, then isolation structure 350 can be formed by spinning on and processing additional polymer layers until trace 344 and the plugs 346 are covered.

Figure 12A:
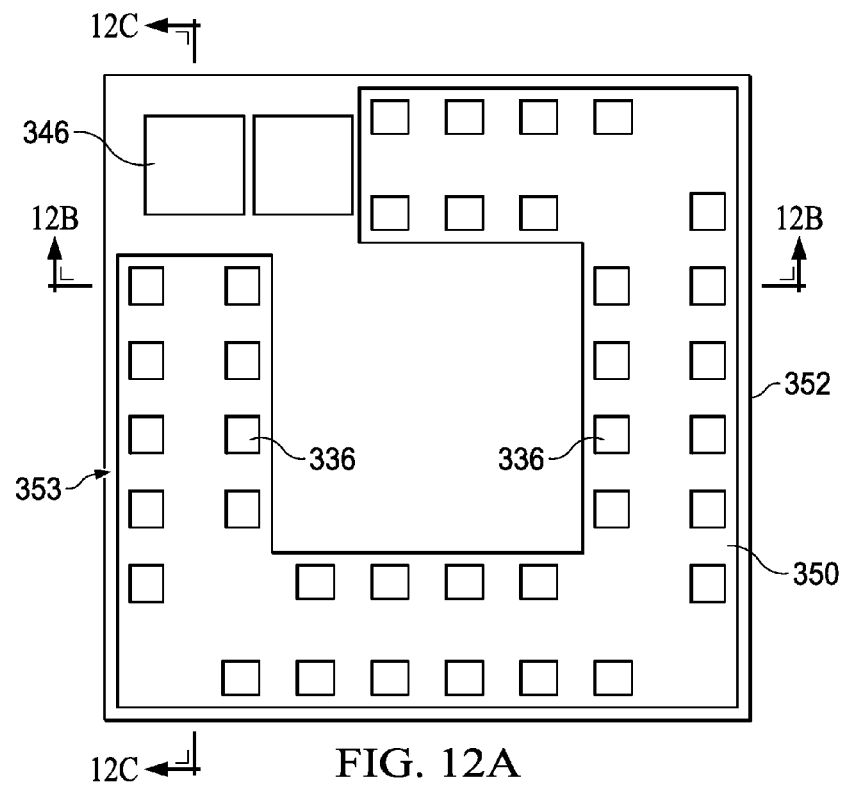
Figure 12B:
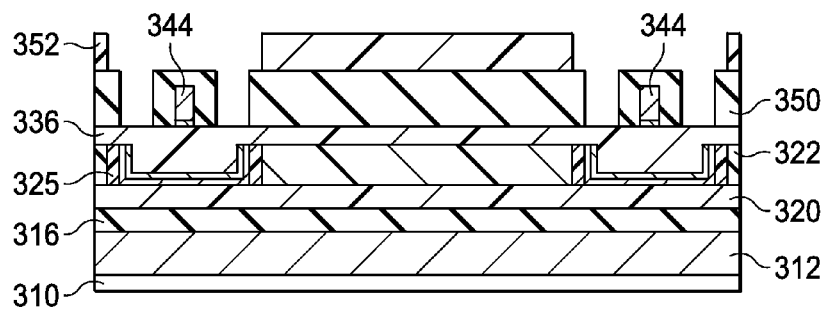
Figure 12C:
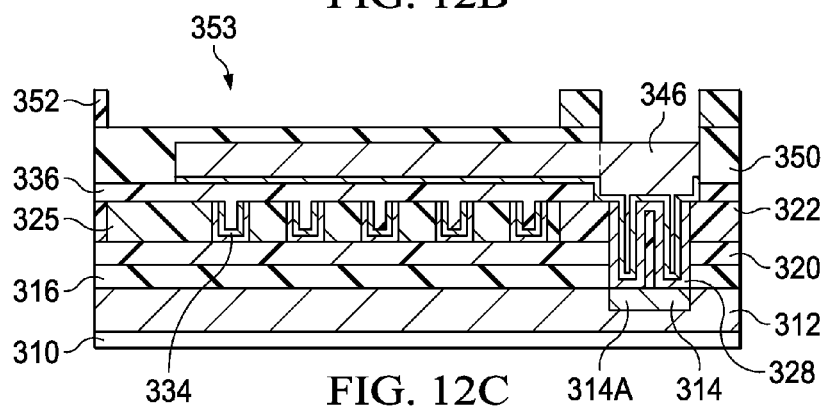

As shown in FIGS. 12A-12C, after isolation structure 350 has been formed, an outer structure 352 is formed on isolation structure 350. In the present example, outer structure 352 is formed by conventionally spinning a polymer, such as a siloxane-based polymer like one of the polymers in the series SINR-3110 through SINR-3170 from Shin-Etsu Chemical, onto the top surface of isolation structure 350 in a conventional manner to form a polymer layer.

After the polymer layer has been formed, the polymer layer is soft baked, and then selectively exposed to ultraviolet light by a mask aligner to transfer a geometric pattern into the soft baked polymer. Following this, the exposed polymer is baked again, and then developed, such as by using immersion development at room temperature.

After the development, the unexposed regions of the developed polymer are rinsed away and removed to form an uncured structure with a large opening 353 and optional openings that expose the plugs 346. Once the unexposed regions of the developed polymer have been removed, the developed polymer is cured to form outer structure 352 with large opening 353 and the optional openings that expose the plugs 346.

Figure 13A:
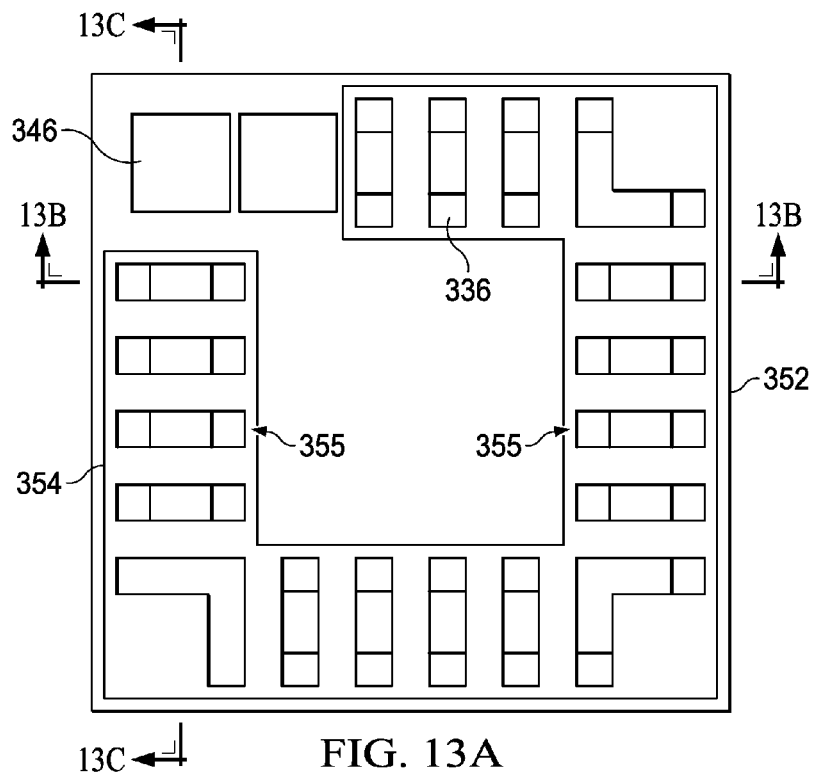
Figure 13B:
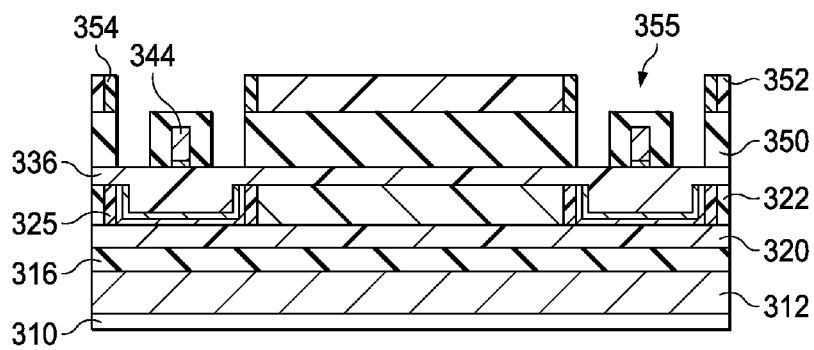
Figure 13C:
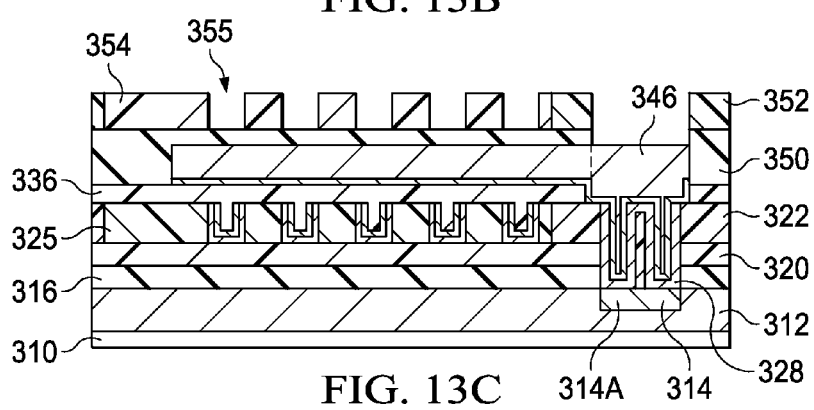

As shown in FIGS. 13A-13C, after outer structure 352 has been formed, an inner structure 354 is formed to lie within large opening 353 and touch isolation structure 350 and outer structure 352. In the present example, inner structure 354 is formed by conventionally spinning a high aspect ratio material, such as SU-8 or TMMR-52000 by TOK, onto the top surface of isolation structure 350 in a conventional manner to fill up large opening 353 and form a material region. (A thin layer of the high aspect ratio material can lie over outer structure 352.)

SU-8 and TMMR-52000 both have high aspect ratios, i.e., 3:1 or higher. In addition, SU-8 and TMMR-52000 both have a high intrinsic stress and a high Young's modulus, and are prone to cracking. Thus, outer structure 352 and inner structure 354 have different material characteristics. Further, inner structure 354 has a maximum aspect ratio that is greater than a maximum aspect ratio of top structure 336, isolation structure 350, and outer structure 352.

After the material layer has been formed, the material layer is soft baked, and then selectively exposed to ultraviolet light by a mask aligner to transfer a geometric pattern into the soft baked material. Following this, the exposed material is baked again, and then developed, such as by using immersion development at room temperature.

After the development, the unexposed regions of the developed material are rinsed away and removed to form a number of lamination openings 355, as well as optional openings that expose the plugs 346. Once the unexposed regions of the developed polymer have been removed, the developed polymer is cured to form inner structure 354 with the lamination openings 355 and the openings that expose the plugs 346.

The lamination openings 355 have high aspect ratios (i.e., 3:1 and higher) that allow a large number of thin magnetic laminations to be subsequently formed. The larger the number of thin magnetic laminations, the larger the magnetic effect. Thus, to obtain a usable level of magnetic effect, it is critical that the lamination openings 355 have high aspect ratios.

Figure 14A:
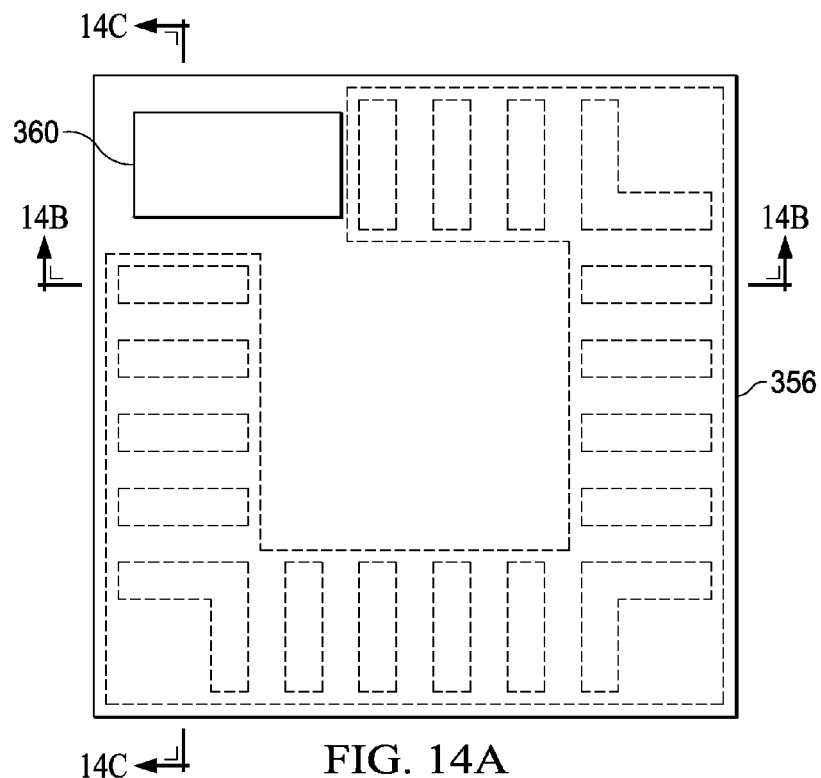
Figure 14B:
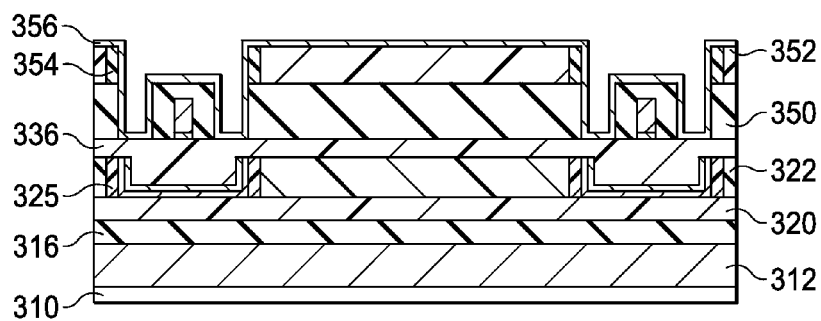
Figure 14C:
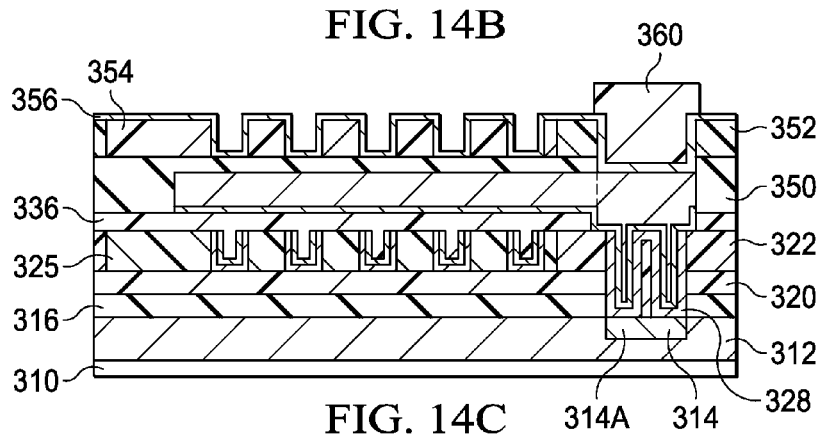

As shown in FIGS. 14A-14C, after inner structure 354 has been formed, a seed layer 356 is formed on isolation structure 350, outer structure 352, and inner structure 354 to line the lamination openings 355. Seed layer 356 can be implemented with, for example, 300 Å of titanium and 3000 Å of copper.

Alternately, seed layer 356 can be implemented with a high-resistance magnetic material, such as amphorous CoTaZr or CoNbZr. Following this, a mask 360 is formed and patterned on seed layer 356 in a conventional manner. As shown in FIGS. 14A-14C, mask 360, which can be implemented with, for example, NR2 by Futurrex (http://futurrex.com/en/), covers and protects the portion of seed layer 356 that lies over the plugs 346 when the plugs 346 are optionally exposed.

Figure 15A:
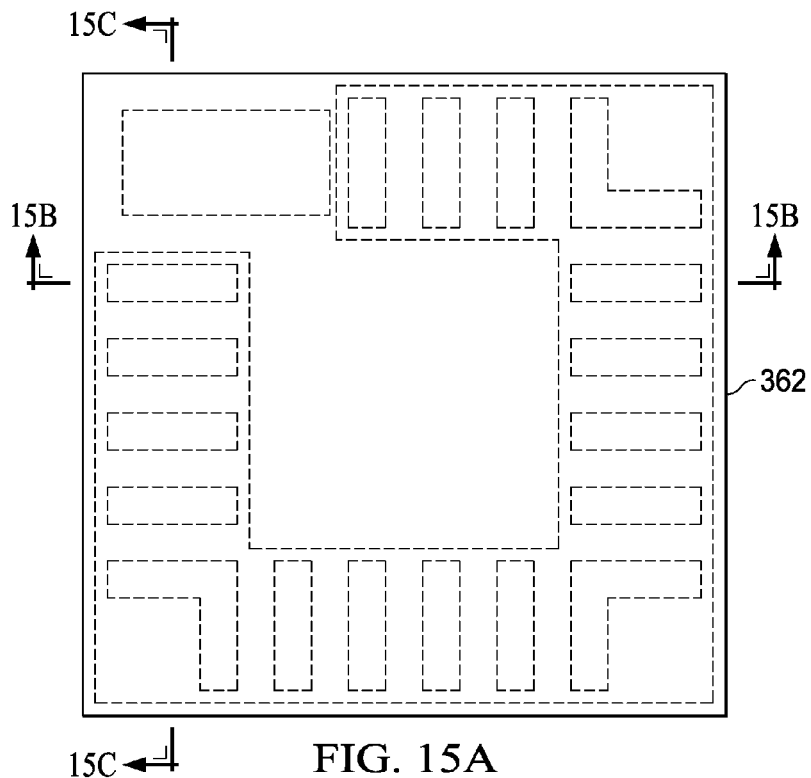
Figure 15B:
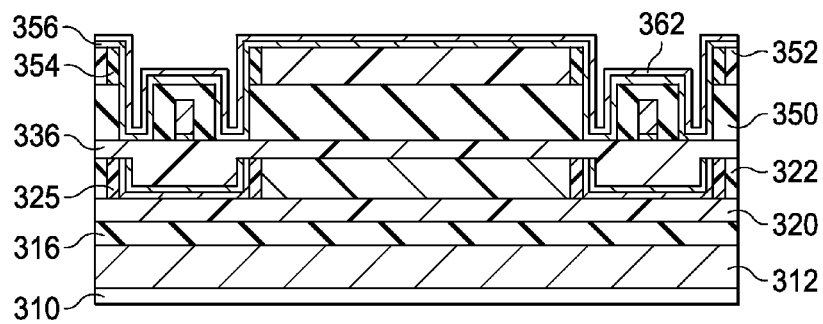
Figure 15C:
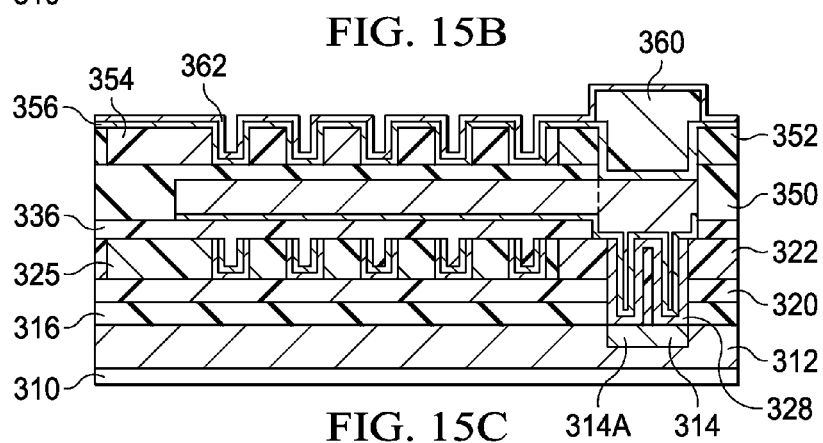

Following the formation of mask 360, as shown in FIGS. 15A-15C, a soft magnetic material, such as $Ni_{80}Fe_{20}$ (permalloy), $Ni_{45}Fe_{20}$ (orthonol), or cobalt nickel iron (CoNiFe), is electroplated to form a magnetic material layer 362 that lines, but does not fill up, the lamination openings 355 in inner structure 354.

Figure 16A:
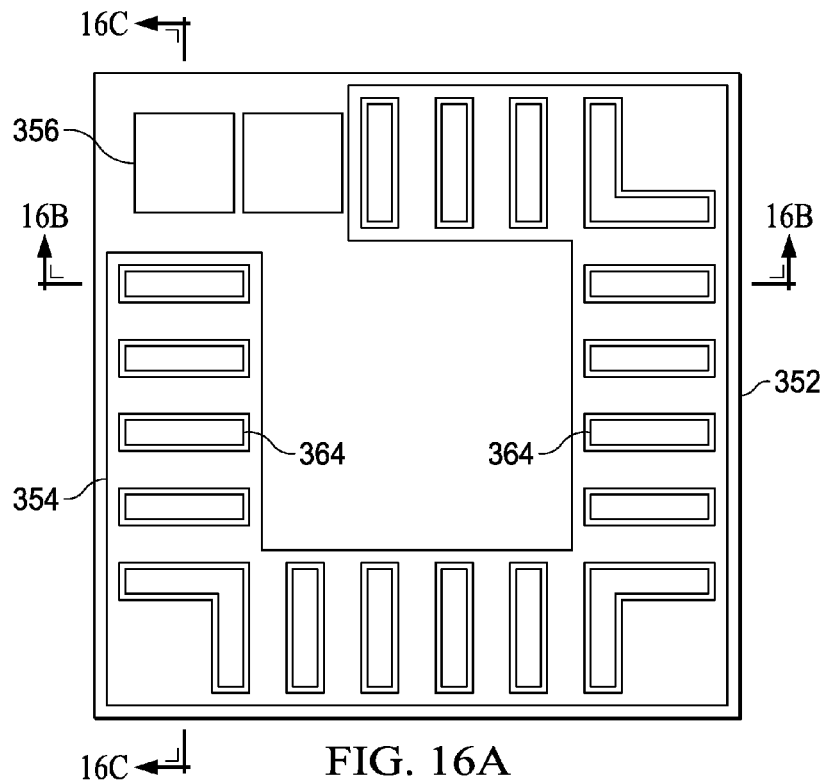
Figure 16B:
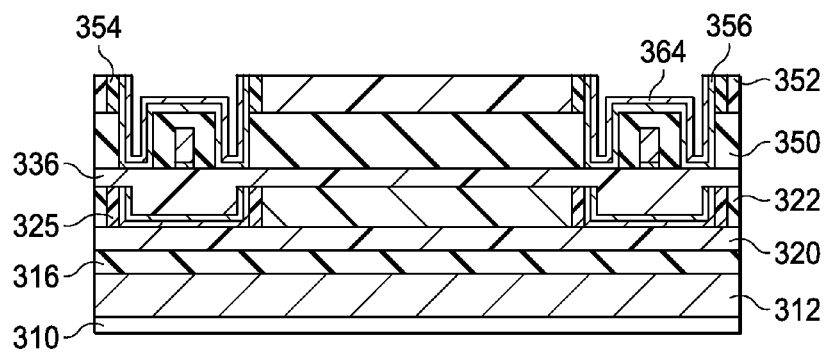
Figure 16C:
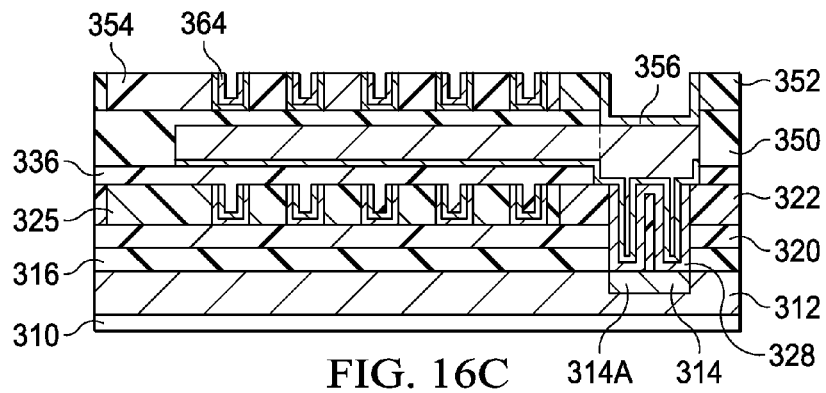

After this, as shown in FIGS. 16A-16C, mask 360, magnetic material layer 362, and small portions of outer structure 352 and inner structure 354 are planarized to form a number of U-shaped controlled-seam magnetic upper laminations 364 that lie directly over the U-shaped controlled-seam magnetic lower laminations 334. Thus, the top surfaces of outer structure 352, inner structure 354, and each of the controlled-seam magnetic upper structures 364 lie substantially in a single plane. The controlled-seam magnetic upper laminations 364 must be thin to minimize eddy currents. Following the planarization, the remains of mask 360 are removed in a conventional manner.

Figure 17A:
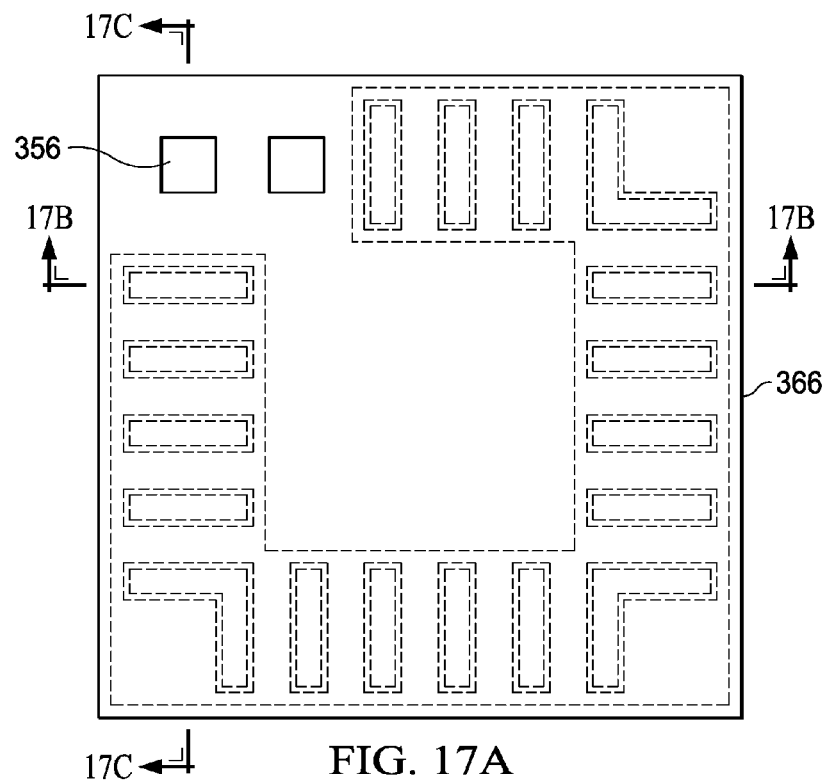
Figure 17B:
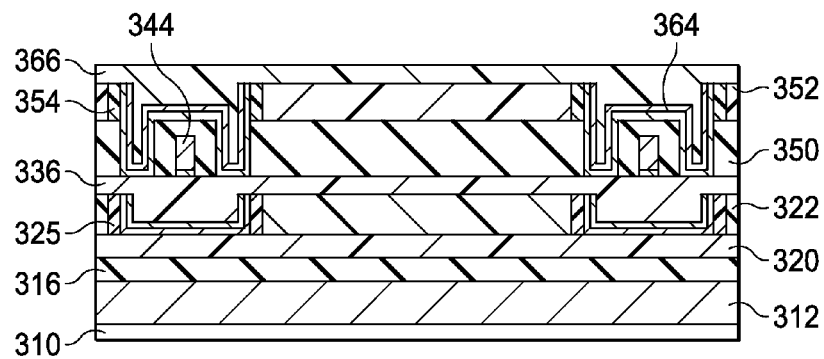
Figure 17C:
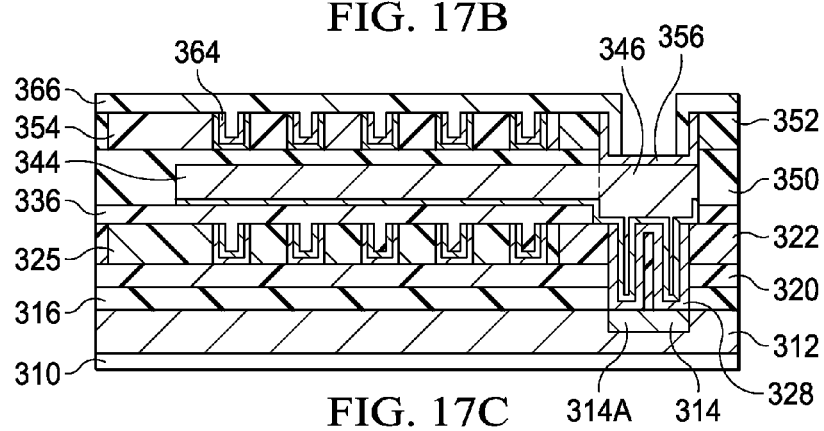

Next, as shown in FIGS. 17A-17C, a top structure 366 is formed on outer structure 352, inner structure 354, and the controlled-seam magnetic upper laminations 364. In the present example, top structure 366 is formed by conventionally spinning a polymer, such as a siloxane-based polymer like one of the polymers in the series SINR-3110 through SINR-3170 from Shin-Etsu Chemical, onto the top surfaces of outer structure 352, inner structure 354, and the controlled-seam magnetic upper laminations 364 in a conventional manner to form a polymer layer.

After the polymer layer has been formed, the polymer layer is soft baked. In the present example, the polymer layer is then selectively exposed to ultraviolet light by a mask aligner to transfer a geometric pattern into the soft baked polymer.

Following this, the exposed polymer is baked again, and then developed, such as by using immersion development at room temperature.

After the development, the unexposed regions of the developed polymer are rinsed away and removed to form openings that expose the portion of the seed layer 356 that covers the plugs 346. Once the unexposed regions of the developed polymer have been removed, the developed polymer is cured to form top structure 366 which, in the present example, has optional openings that expose the portion of the seed layer 356 that covers the plugs 346.

Thus, a MEMS power inductor and a method of forming the inductor have been described. The MEMS power inductor has lower and upper magnetic laminations which are formed in a material that has a high aspect ratio, while a material with a low aspect ratio but high crack resistance is formed to surround and protect the material with the high aspect ratio.

FIGS. 18A-18C through FIGS. 20A-20C show views that illustrate an example of an alternate method of forming a MEMS power inductor in accordance with the present invention. FIGS. 18A-20A show plan views, while FIGS. 18B-20B show cross-sectional views taken along line 18B-18B through line 20B-20B of FIGS. 18A-20A, respectively, and FIGS. 18C-20C show cross-sectional views taken along line 18C-18C through line 20C-20C of FIGS. 18A-20A, respectively.

Figure 18A:
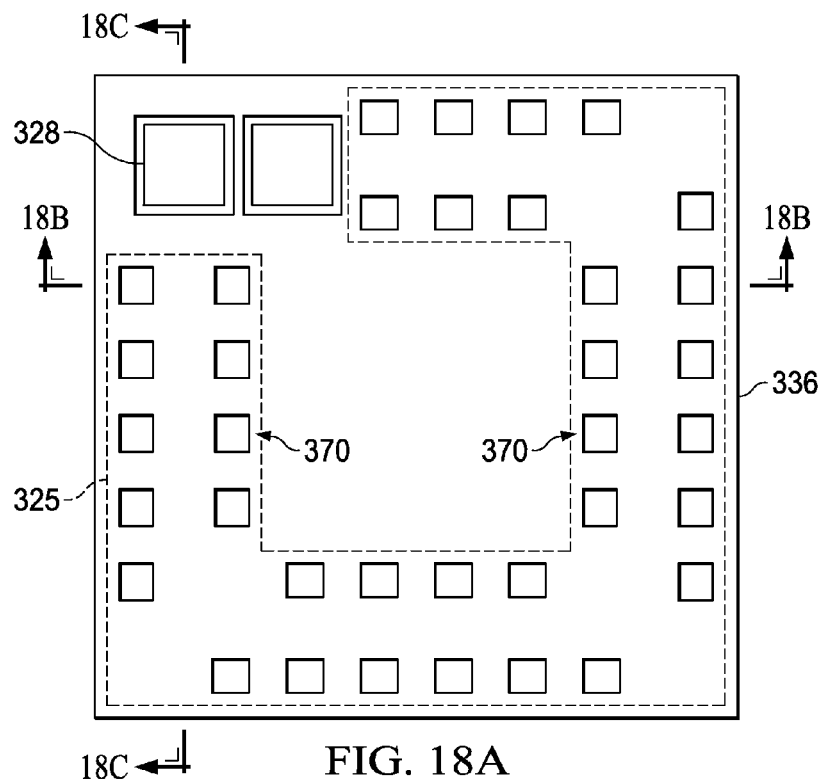
FIGS. 18A-18C through FIGS. 20A-20C are views illustrating an example of an alternate method of forming a MEMS power inductor in accordance with the present invention.
Figure 18B:
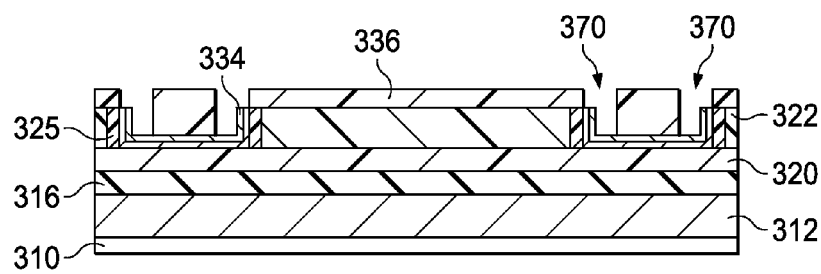
Figure 18C:
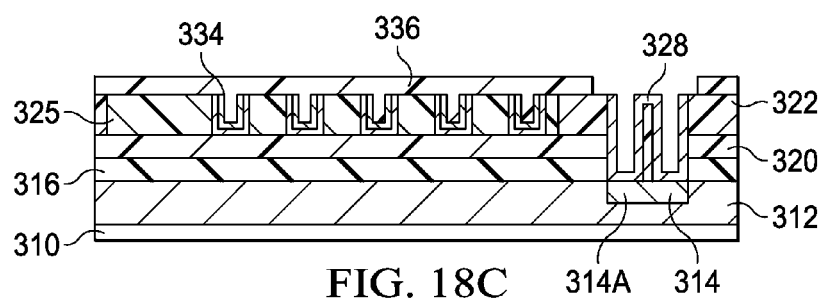

Turning first to FIGS. 9A-9C, these figures show that top structure 336 has no openings that expose the controlled-seam magnetic lower laminations 334. Alternately, as shown in FIGS. 18A-18C, top structure 336 can be formed with openings 370 that expose the opposite ends of each controlled-seam magnetic lower lamination 334. The openings 370 can be formed in the same manner that the openings which expose the portion of the seed layer 328 that covers the bond pad structures 314A and 314B are formed.

Figure 19A:
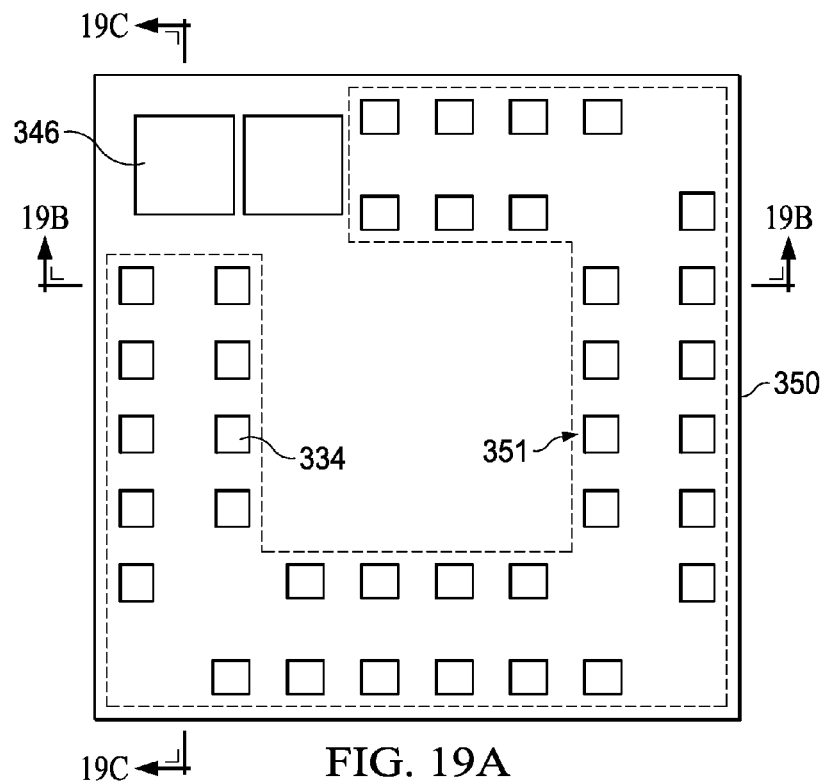
Figure 19B:
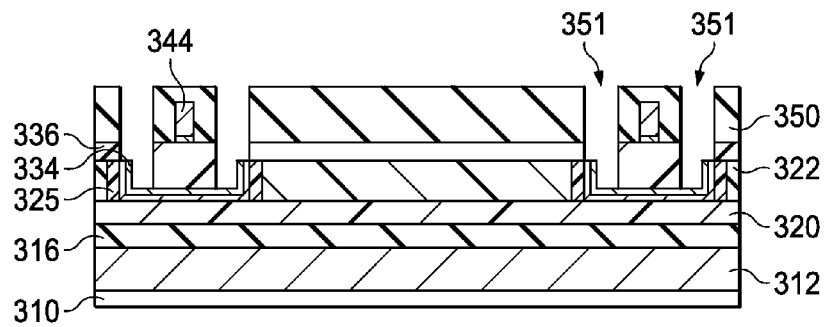
Figure 19C:
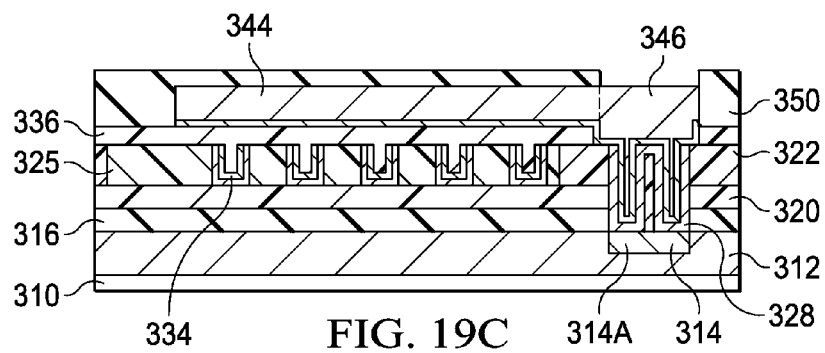
Figure 20A:
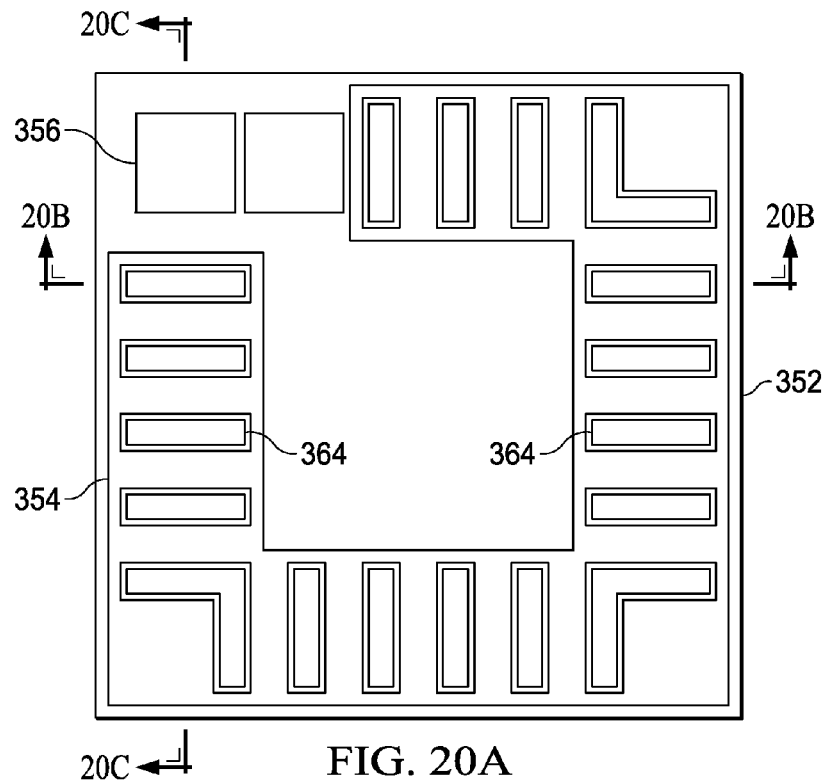
Figure 20B:
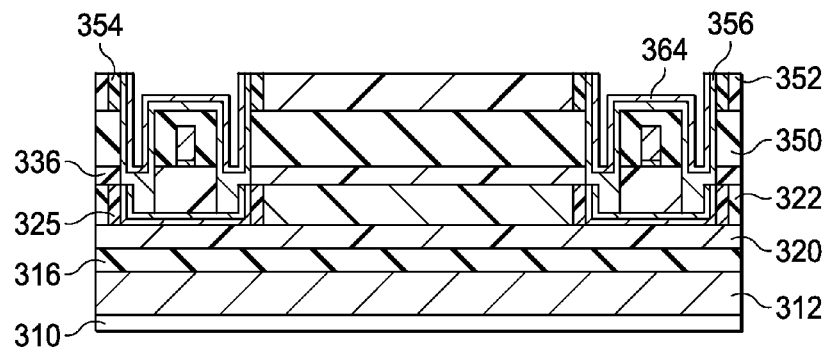
Figure 20C:
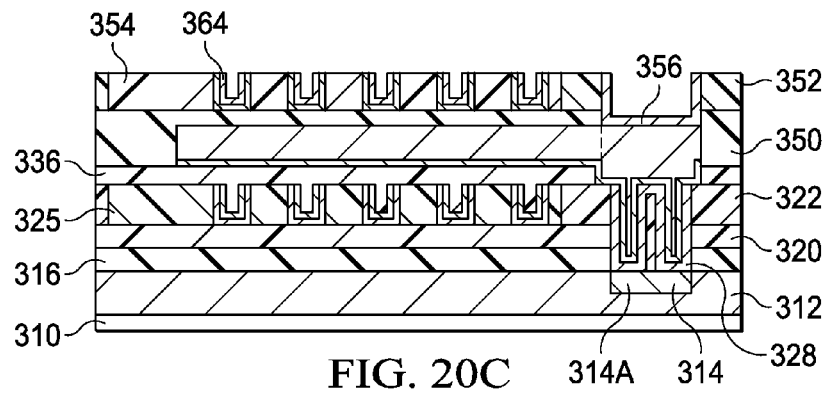

After top structure 336 with the openings 370 and the openings which expose the portion of the seed layer 328 that covers the bond pad structures 314A and 314B has been formed, the alternate method continues as above. As a result, as shown in FIGS. 19A-19C, when isolation structure 350 is formed, the openings 351 also expose the opposite ends of each controlled-seam magnetic lower lamination 334. Thus, as shown in FIGS. 20A-20C, when the controlled-seam magnetic upper laminations 364 are formed, the controlled-seam magnetic upper lamination 364 touch the opposite ends of each controlled-seam magnetic lower lamination 334.

In a second alternate embodiment of the present invention, the formation of bottom structure 320 can be optionally omitted. As a result, outer structure 322, inner structure 325, and the controlled-seam magnetic lower lamination 334 are each formed on top the top surface of passivation layer 116.

It should be understood that the above descriptions are examples of the present invention, and that various alternatives of the invention described herein may be employed in practicing the invention. Therefore, it is intended that the following claims define the scope of the invention and that structures and methods within the scope of these claims and their equivalents be covered thereby.

What is claimed is:

1. A semiconductor inductor comprising:
   a first structure being non-conductive and having a top surface;
   a second structure being non-conductive and having a top surface, a side wall surface, and a bottom surface, the bottom surface touching the top surface of the first structure;
   a third structure being non-conductive and having a top surface, a side wall surface, and a bottom surface, the bottom surface of the third structure touching the top surface of the first structure, the side wall surface of the third structure touching the side wall surface of the second structure, the second structure and the third structure having different material characteristics;
   a plurality of lower magnetic structures that touch the first and third structures, each lower magnetic structure having a top surface, and being spaced apart and electrically isolated from each other lower magnetic structure;
   a fourth structure being non-conductive and having a top surface, and a bottom surface, the bottom surface of the fourth structure touching the top surfaces of the second structure, the third structure, and each lower magnetic structure; and
   a conductive trace having a top surface, touching the fourth structure, and lying directly over and spaced apart from each of the lower magnetic structures.

2. The semiconductor inductor of claim 1 wherein the conductive trace has a number of loops.

3. The semiconductor inductor of claim 1 wherein the plurality of lower magnetic structures are spaced apart from the second non-conductive structure.

4. The semiconductor inductor of claim 1 wherein:
   the first, second, and fourth structures each has a low intrinsic stress and a low Young's modulus; and
   the third structure has a high intrinsic stress and a high Young's modulus.

5. The semiconductor inductor of claim 1 wherein the first, second, and fourth structures have a maximum aspect ratio that is less than a maximum aspect ratio of the second structure.

6. The semiconductor inductor of claim 1 wherein the plurality of lower magnetic structures each includes NiFe.

7. The semiconductor inductor of claim 1 wherein the conductive trace includes copper.

8. The semiconductor inductor of claim 1 wherein the top surfaces of second structure, the third structure, and each of the plurality of lower magnetic structures lie substantially in a single plane.

9. The semiconductor inductor of claim 1 and further comprising a fifth structure being non-conductive and having a low intrinsic stress, a top surface, and a bottom surface, the bottom surface of the fifth structure touching the top surfaces of the fourth structure and the conductive trace.

10. The semiconductor inductor of claim 9 and further comprising:
    a sixth structure being non-conductive and having a low intrinsic stress, a top surface, a side wall surface, and a bottom surface, the bottom surface of the sixth structure touching the top surface of the fifth structure; and
    a seventh structure being non-conductive and having a high intrinsic stress, a top surface, a side wall surface, and a bottom surface, the bottom surface of the seventh structure touching the top surface of the fifth structure, the side wall surface of the seventh structure touching the side wall surface of the sixth structure.

11. The semiconductor inductor of claim 10 and further comprising a plurality of upper magnetic structures that touch the fifth and seventh structures, each upper magnetic structure having a top surface, and being spaced apart and electrically isolated from each other upper magnetic structure.

12. The semiconductor inductor of claim 11 wherein each lower magnetic structure lines a lower lamination opening, no lower magnetic structure filling a lamination opening.

13. The semiconductor inductor of claim 12 wherein each upper magnetic structure lines an upper lamination opening, no lower magnetic structure filling an upper lamination opening.

14. The semiconductor inductor of claim 11 wherein each upper magnetic structure lies horizontally adjacent to and spaced apart from the conductive trace.

15. The semiconductor inductor of claim 11 and further comprising an eighth structure being non-conductive and having a low intrinsic stress, a top surface, and a bottom surface, the bottom surface of the eighth structure touching the top surfaces of the sixth structure, the seventh structure, and each upper magnetic structure.

16. The semiconductor inductor of claim 11 wherein each upper magnetic structure lies directly vertically above a corresponding lower magnetic structure.

17. The semiconductor inductor of claim 16 wherein each upper magnetic structure is spaced apart from the corresponding lower magnetic structure.

18. The semiconductor inductor of claim 16 wherein each upper magnetic structure touches the corresponding lower magnetic structure.

19. The semiconductor inductor of claim 11 wherein the top surfaces of sixth structure, the seventh structure, and each of the plurality of upper magnetic structures lie substantially in a single plane.

20. A method of forming a semiconductor inductor comprising:

forming a first structure being non-conductive and having a top surface;

forming a second structure being non-conductive and having a top surface, a side wall surface, and a bottom surface, the bottom surface touching the top surface of the first structure;

forming a third structure being non-conductive and having a top surface, a side wall surface, and a bottom surface, the bottom surface of the third structure touching the top surface of the first structure, the side wall surface of the third structure touching the side wall surface of the second structure, the second structure and the third structure having different material characteristics;

forming a plurality of lower magnetic structures that touch the first and third structures, each lower magnetic structure having a top surface, and being spaced apart and electrically isolated from each other lower magnetic structure;

forming a fourth structure being non-conductive and having a top surface, and a bottom surface, the bottom surface of the fourth structure touching the top surfaces of the second structure, the third structure, and each lower magnetic structure; and forming a conductive trace having a top surface, touching the fourth structure, and lying directly over and spaced apart from each of the lower magnetic structures.

* * * * *